(12) United States Patent
Shin et al.

(10) Patent No.: US 11,479,207 B2
(45) Date of Patent: Oct. 25, 2022

(54) CONTROLLING BATTERY OUTPUT POWER TO PREVENT VEHICLE THEFT

(71) Applicants: THE REGENTS OF THE UNIVERSITY OF MICHIGAN, Ann Arbor, MI (US); THE UNIVERSITY OF COLORADO, Denver, CO (US)

(72) Inventors: Kang G. Shin, Ann Arbor, MI (US); Liang He, Ann Arbor, MI (US)

(73) Assignees: THE REGENTS OF THE UNIVERSITY OF MICHIGAN, Ann Arbor, MI (US); THE UNIVERSITY OF COLORADO, Denver, CO (US)

( * ) Notice: Subject to any disclaimer, the term of this patent is extended or adjusted under 35 U.S.C. 154(b) by 334 days.

(21) Appl. No.: 16/823,647

(22) Filed: Mar. 19, 2020

(65) Prior Publication Data

US 2020/0298797 A1 Sep. 24, 2020

Related U.S. Application Data

(60) Provisional application No. 62/821,738, filed on Mar. 21, 2019.

(51) Int. Cl.
*B60R 25/045* (2013.01)
*B60R 25/30* (2013.01)
(Continued)

(52) U.S. Cl.
CPC ........ *B60R 25/045* (2013.01); *B60R 25/1004* (2013.01); *B60R 25/252* (2013.01); *B60R 25/30* (2013.01); *G01R 31/3835* (2019.01)

(58) Field of Classification Search
CPC ... B60R 25/00; B60R 25/045; B60R 25/1003; B60R 25/1004; B60R 25/24; B60R 25/252; B60R 25/30; G01R 31/3835; G01R 31/36; G07C 5/00; G07C 5/0084; G07C 5/04; G07C 9/00; G07C 9/00182
See application file for complete search history.

(56) References Cited

U.S. PATENT DOCUMENTS

| | | | | |
|---|---|---|---|---|
| 6,140,939 A | * | 10/2000 | Flick | G07C 9/00563 340/12.55 |
| 11,042,614 B2 | * | 6/2021 | Goto | G06V 40/10 |

(Continued)

OTHER PUBLICATIONS

NPL Search (dated Apr. 13, 2022).*

*Primary Examiner* — Van T Trieu
(74) *Attorney, Agent, or Firm* — Harness, Dickey & Pierce, P.L.C.

(57) ABSTRACT

A method is presented for controlling power output by a battery in a vehicle. The method includes: measuring voltage of the battery during a sequence of vehicle events to form a time series, where each vehicle event is powered by the battery; constructing an unknown fingerprint from the voltage measurements made during the sequence of vehicle events, where the unknown fingerprint is indicative of a sequence of vehicle events; comparing the unknown fingerprint to the at least one fingerprint; receiving a start signal, where the start signal is a request to start the engine of the vehicle; and, in response to receiving the start signal and based on the comparison of the unknown fingerprint to the at least one fingerprint, outputting electric power from the battery to an electric starter motor of the vehicle.

19 Claims, 19 Drawing Sheets

(51) Int. Cl.
*G01R 31/3835* (2019.01)
*B60R 25/10* (2013.01)
*B60R 25/25* (2013.01)

(56) References Cited

U.S. PATENT DOCUMENTS

2019/0158340 A1* 5/2019 Zhang .................. H04B 17/309
2020/0090425 A1* 3/2020 Senft-Grupp ............ G07C 5/08
2020/0298797 A1* 9/2020 Shin .................... B60R 25/1004

* cited by examiner

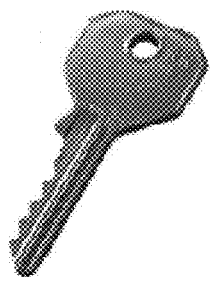 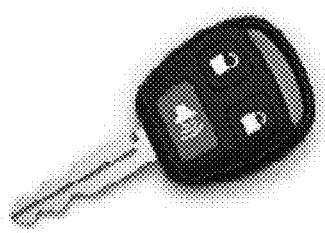 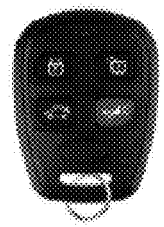
FIG. 1A　　　　　FIG. 1B　　　　　FIG. 1C
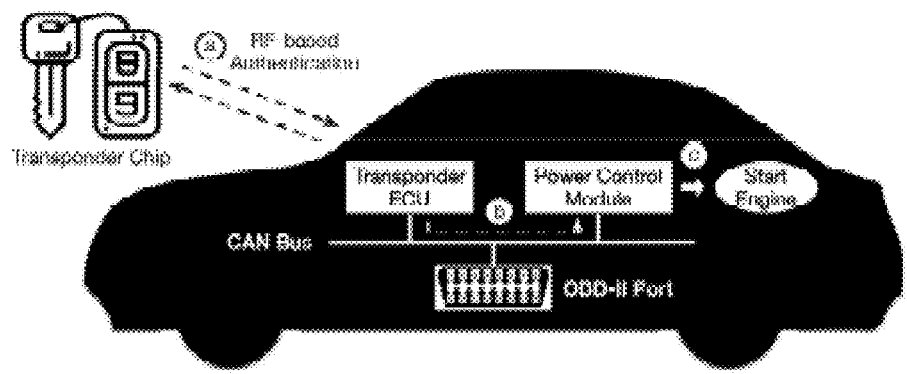
FIG. 2

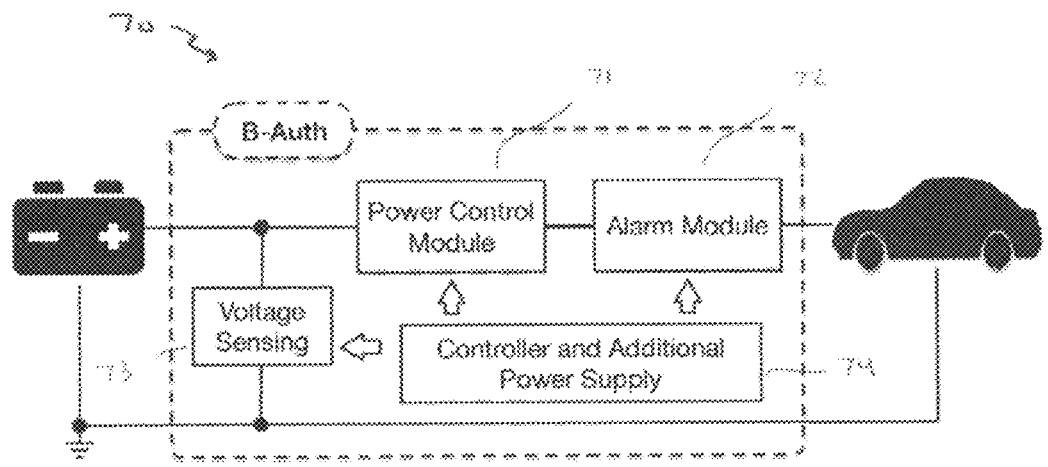
FIG. 7A
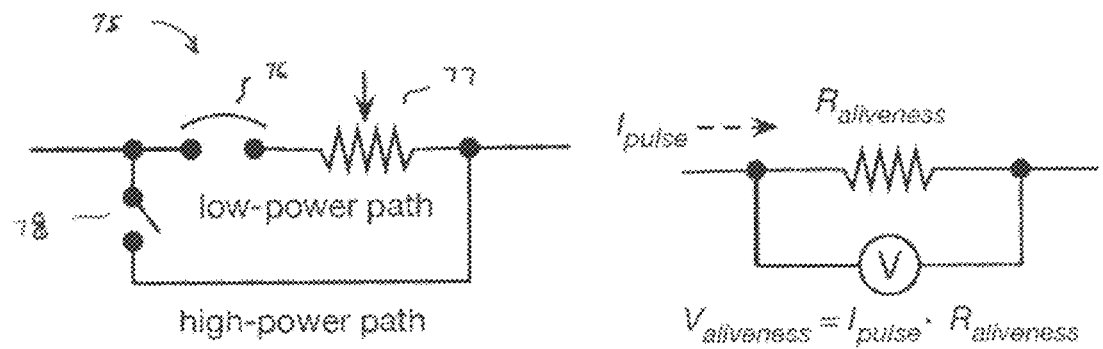
FIG. 7B
FIG. 7C

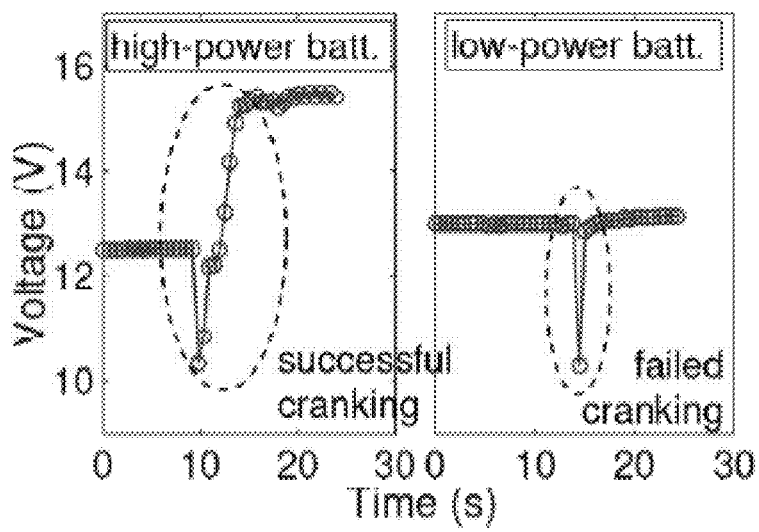
FIG. 8A  FIG. 8B
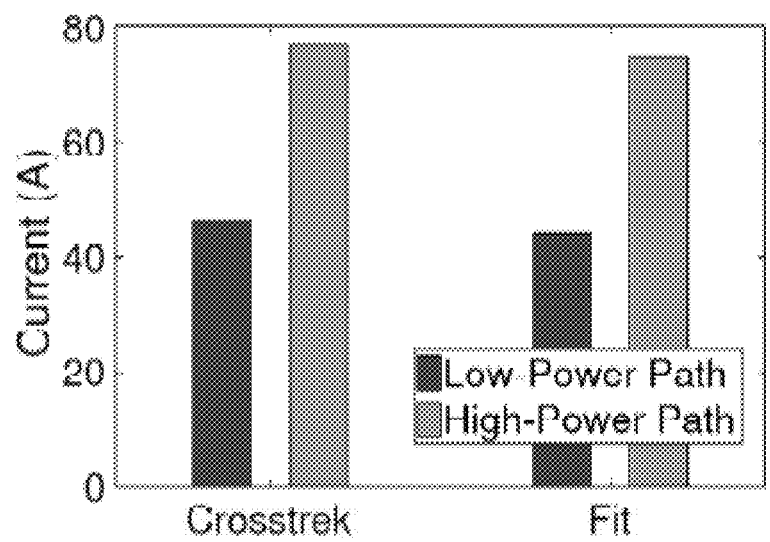
FIG. 9

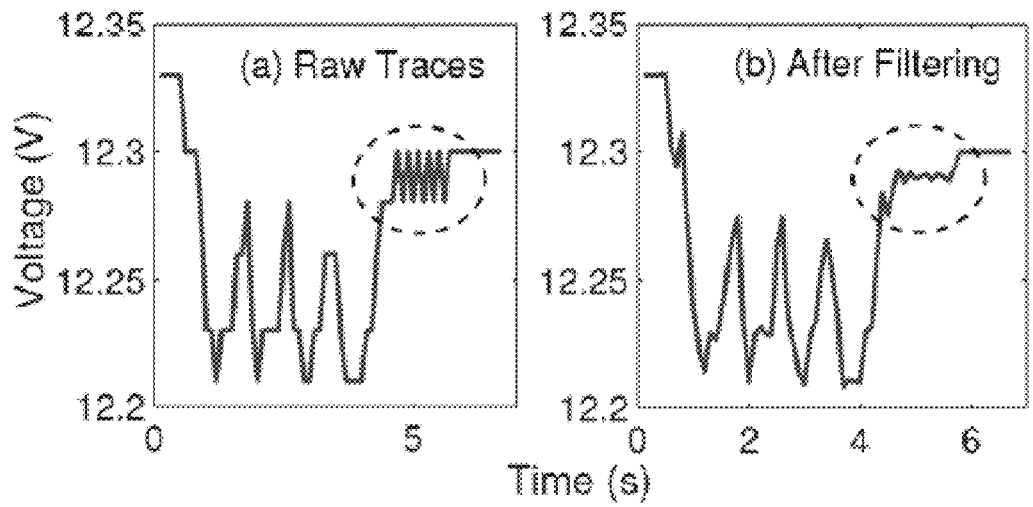
FIG. 15A  FIG. 15B
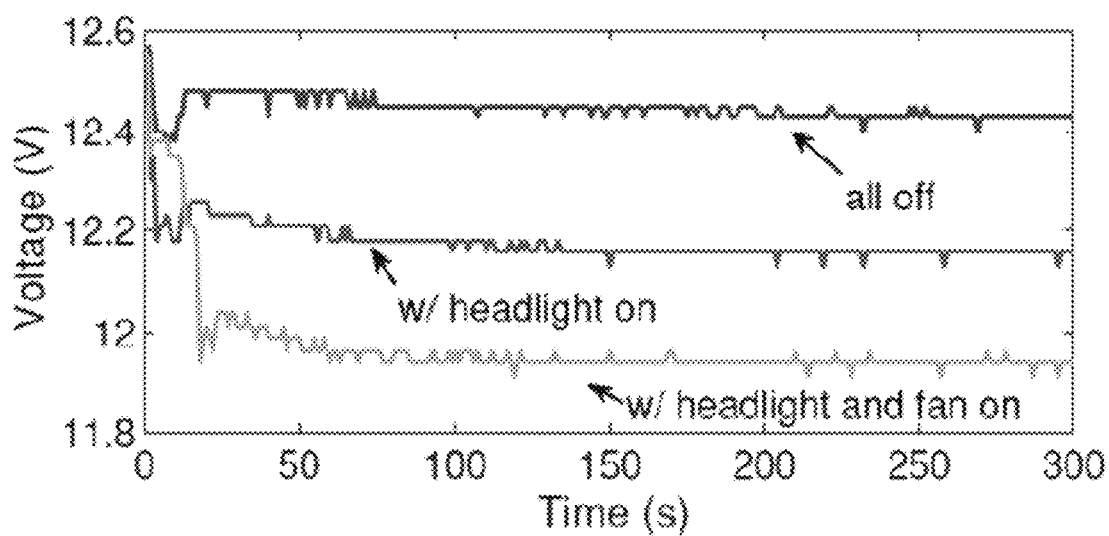
FIG. 16

A: Swipe front windshield wiper twice
B: Move driver side window down & up
C: Turn headlight on and off
D: Turn fan to max and off
E: Unlock and lock doors

CONTROLLING BATTERY OUTPUT POWER TO PREVENT VEHICLE THEFT

CROSS-REFERENCE TO RELATED APPLICATIONS

This application claims the benefit of U.S. Provisional Application No. 62/821,738, filed on Mar. 21, 2019. The entire disclosure the above application is incorporated herein by reference.

GOVERNMENT CLAUSE

This invention was made with government support under CNS1739577 awarded by the National Science Foundation. The government has certain rights in the invention.

FIELD

The present disclosure relates to controlling battery output power to prevent vehicle theft.

BACKGROUND

Various key-based auto-theft prevention systems have been developed and deployed, allowing the vehicle to start only upon successful authentication. Nevertheless, there was an 11.5% increase of auto thefts in the US during 2014-16, reaching a total of 765,484 thefts, or one theft every 40 s. These auto thefts have an average recovery rate of only 45%, costing a total of $5.9 million or $7,680 per theft.

FIGS. 1A-1C show three common key-based vehicle authentication systems: a metal key, an RF-integrated metal key, and a smart-key fob. The metal key is a physical medium to match the key with the vehicle, but is vulnerable to hot wiring. With reference to FIG. 2, integrating an RF chip with the metal key mitigates hot-wirings by matching the digital code exchanged wirelessly between the key and the vehicle. To do so, (a) the vehicle's transponder electric control unit (ECU)—usually located in the steering column—communicates wirelessly with the key for cyber authentication; (b) the transponder ECU notifies the vehicle's power control module of the result of cyber authentication via the in-vehicle network, such as CAN; and (c) the power control module enables the ignition switch, thus the cranking of engine, if the cyber authentication is successful. Besides their function of RF-integrated keys, smart key-fobs improve user convenience by removing the physical authentication: enabling the ignition switch if (i) the key-fob is within the vehicle's close proximity (e.g., within 2.5' for 2018 Infiniti Q50) and (ii) the RF-based cyber authentication is successful. These solutions, however, cannot reliably prevent vehicle thefts—as witnessed by the aforementioned large/increasing number of auto thefts—due to the following two limitations.

First, all existing systems rely solely on a key (or a key-fob) for theft prevention, making the key a single-point-of-failure, i.e., anyone with the key or key-fob gains the full control of the vehicle. Such a key-rooted vulnerability has been frequently exploited by auto thieves—i.e., 57,096 vehicles are stolen in 2015 with keys left inside the car, a 22% increase over 2014—and becomes even worse if it is easier and cheaper to clone keys.

Second, the cyber components of existing authentication systems—i.e., RF-based and in-vehicle communications—are vulnerable to cyber attacks. RF communications suffer from a variety of jamming/relay attacks, making fake authentication possible. Also, all communications on the in-vehicle network suffer from potential eavesdropping/fabrication via the OBD-II port, making it possible to bypass the authentication.

To mitigate these limitations, a battery authentication system is presented using vehicle batteries, thereby providing an additional anti-theft protection atop key-based authentication. The battery authentication system could be an add-on module or integrated into vehicles by OEMs. The battery authentication system is inspired by three observations: (i) the vehicle's engine would not start if the battery does not supply enough power, (ii) the power required to crank the engine is much higher than that to power the vehicle's e-systems (e.g., lights, wipers, air-con, etc.), and (iii) operating a vehicle's e-systems triggers unique voltages of its battery. Based on these observations, the battery authentication system authenticates the driver by having him/her customize a sequence of e-system operations as an "authentication code", and validates the driver by matching the online-triggered battery voltages with his/her authentication code. Unless such a voltage matching is successful, the battery authentication system will lower the battery power output to disable the cranking of engine, thus preventing the vehicle theft. The system's selective reduction of battery power output is achieved with hardware installed between the battery and the vehicle. The hardware includes (i) a low-power path allowing only enough power to operate the vehicle's e-systems but not enough to crank the engine, (ii) a high-power path allowing sufficient power to crank the engine, and (iii) a switch enabling/disabling the high-power path between the battery and the vehicle.

The challenges of the battery authentication system are two-fold. First, battery voltage fluctuates due to disturbances from different sources, such as the background operation of e-systems, the variations of drivers' certain operations (e.g., turning the speed dial of vehicle's air-conditioner with different speeds), and the aging of battery. As a result, even the same e-system operation may trigger different battery voltages. The battery authentication system mitigates these voltage variations with a set of customized data-driven approaches, including pre-processing of real-time voltage readings, voltage matching, and online update of voltage fingerprints. The battery authentication system also has to run 24/7 to ensure its availability whenever the driver needs to drive the vehicle, rendering its energy-efficiency crucial. The battery authentication system reduces its energy consumption by residing in sleep state, and transiting to active state only when a driver authentication is needed. The transitions between the two states are determined by inferring the vehicle's operational status based on battery voltages.

The battery authentication system has the following salient features. The battery authentication system exploits the vehicle batteries as sensors/actuators (besides as a power supply/storage) to authenticate the driver and disable/enable the cranking of engine. This way, the battery authentication system provides an additional anti-theft protection for vehicles on top of existing key-based authentication systems, i.e., thieves cannot steal your car even with your car key or key-fob.

The battery authentication system first authenticates drivers based on the battery voltages, which encode their customized authenticating operations via vehicle power-line network, and then "physically" dis/enables the cranking of engine based on the authentication results. Thus, the battery authentication system is grounded on a hardware-based root-of-trust, neither requiring any wireless communications nor depending on the in-vehicle network—thieves cannot steal your car via cyberattacks.

This section provides background information related to the present disclosure which is not necessarily prior art.

SUMMARY

This section provides a general summary of the disclosure, and is not a comprehensive disclosure of its full scope or all of its features.

A method is presented for controlling power output by a battery in a vehicle. At least one fingerprint is stored by a controller in the vehicle, where the fingerprint is indicative of a sequence of vehicle events and is derived from voltage measurements of the battery during the sequence of vehicle events. The method includes: measuring voltage of the battery during a sequence of vehicle events to form a time series, where each vehicle event is powered by the battery; constructing an unknown fingerprint from the voltage measurements made during the sequence of vehicle events, where the unknown fingerprint is indicative of a sequence of vehicle events; comparing the unknown fingerprint to the at least one fingerprint; receiving a start signal, where the start signal is a request to start the engine of the vehicle; and, in response to receiving the start signal and based on the comparison of the unknown fingerprint to the at least one fingerprint, outputting electric power from the battery to an electric starter motor of the vehicle. When a mismatch between the unknown fingerprint and the at least one fingerprint occurs, electric power output from the battery to the electric starter motor is restricted.

Example vehicle events include but are not limited to turning on/off headlights, unlocking and locking doors, activating and deactivating windshield wipers and opening and closing a window.

In some embodiments, the unknown fingerprint is compared to the at least one fingerprint using a similarity metric or using dynamic time warping.

In another aspect, a driver authentication system is presented. The driver authentication system includes: a switching circuit, a voltage sense circuit, a data store and a controller. The switching circuit interconnects a vehicle battery with an electric starter motor, where the switching circuit includes a low power circuit path, a high power circuit path and a switch that selectively connects the battery to at least one of the low power circuit path or the high power circuit path. The voltage sense circuit is configured to measure voltage across the battery. The data store stores one or more fingerprints, where each of the one or more fingerprints is indicative of a sequence of vehicle events and is derived from voltage measurements of the battery during the sequence of vehicle events. A controller is interfaced with the voltage sense circuit and the switch. The controller constructs an unknown fingerprint from the voltage measurements made during a sequence of vehicle events, compares the unknown fingerprint to the one or more fingerprints and actuates the switch based on the comparison of the unknown fingerprint to the one or more fingerprints, where each vehicle event is powered by the battery.

In one embodiment, the high power circuit path of the switching circuit is coupled directly between the battery and the electric starter motor, the low power circuit path is arranged in parallel with the high power circuit path, and the switch is disposed in the low power circuit path in an open position. In response to a match between the unknown fingerprint and at least one of the one or more fingerprints, the controller operates to close the switch in the switching circuit.

In some embodiments, the driver authentication system further includes an alarm interfaced with the controller, where the controller activates the alarm in response to a mismatch between the unknown fingerprint and at least one of the one or more fingerprints.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 1A-1C shows three common keys (or key-fobs) used to authenticate the driver.

FIG. 2 is a diagram showing existing anti-theft solutions to authenticate the driver using RF communications and then enable the cranking of engine via the in-vehicle network.

FIG. 7A is a diagram of an example embodiment of a battery authentication system.

FIG. 7B is a schematic showing an example switching circuit.

FIG. 7C is a schematic showing how the alarm module detects, and responds to, the unauthorized cranking of engine and uninstalling of the system from the vehicle.

FIGS. 8A and 8B are graphs showing disabling and enabling cranking of engine, respectively, by controlling battery's power mode.

FIG. 9 is a graph showing current flow on low-power path and a high-power path when cranking with a high-power battery.

FIGS. 15A and 15B are graphs showing how to the high-freq. fluctuations of voltage readings can be reduced using a low-pass filter.

FIG. 16 is a graph showing intensive background operations of e-systems lower battery voltage.

Corresponding reference numerals indicate corresponding parts throughout the several views of the drawings.

DETAILED DESCRIPTION

Example embodiments will now be described more fully with reference to the accompanying drawings.

By way of background, an adversary who wants to steal a vehicle using a common auto-theft scheme, such as use of stolen/cloned keys, radio jamming/relay, and OBD hacking is considered. Although the battery authentication system's anti-theft protection remains intact so long as the customized authentication operations are kept secret to robbers. Security-by-obscurity is known to be not secure: thieves are likely to accumulate enough knowledge of the battery authentication system over time, and may thus attempt to remove the system physically from the vehicle once they gain access to the vehicle's engine compartment. The battery authentication system, albeit unable to prevent such illegal removal attempts, has a built-in detection, and triggers a siren upon detection of such attempts. Also, by keeping the vehicle battery in low-power mode by default, the battery authentication system's theft prevention persists even if thieves have physically broken the battery authentication system, in which case the battery and the vehicle would be either disconnected or connected via the low-power path, both of which prevents the cranking of engine. Note that battery authentication system, whenever operating, is assumed to be trustworthy, i.e., the adversary cannot hack the battery authentication system's specific components to make them malfunction. This trust model can be ensured by (i) protecting the battery authentication system with a well-designed case if provided as an add-on module to commodity vehicles, or (ii) integrating the battery authentication system with vehicles if provided by OEMs as a before-market product (and thus not being exposed to the adversary.

Vehicle batteries can be used to physically authenticate drivers and dis/enable the engine, thus preventing auto theft. Vehicle battery—commonly a rechargeable lead-acid battery with 12/24V nominal voltage depending on vehicle type—plays two distinct roles while discharging:

Role-I: power the starter motor to crank the engine;
Role-II: power the vehicle's e-systems, such as headlight, windshield wiper, fan, etc., but not the engine.

The battery will be charged by the vehicle's alternator when the engine is running, with the power generated by the engine motor's rotation. It is important to note that even (hybrid) electric vehicles, such as Chevrolet Volt—which use high-voltage (e.g., up to 400V) battery packs to supply the driving power—are equipped with separate low-voltage batteries, to ensure their compatibility to the standard 12/24V automotive accessories.

Figure 3:
FIG. 3 is a graph showing that Battery Role-I (cranking the engine) requires much more power than Role-II (powering vehicle's e-systems).

Role-I requires a much higher power output from the battery than Role-II. FIG. 3 summarizes measurements on the battery's discharge current when serving the two roles on 2018 Subaru Crosstrek and 2008 Honda Fit. FIG. 3 shows that Role-I requires a 3-4× higher discharge current than Role-II. Note the discharge current with Role-I is collected when cranking the engine with all e-systems (whichever possible) turned off, while the maximum current with Role-II is achieved by turning on all the vehicle e-systems (and to the maximum when applicable, e.g., with fans). These much different power requirements of the two roles reveal the existence of a power level that supports Role-II but not Role-I, which is used as the basis for the battery authentication system.

These two roles of vehicle batteries can be exploited to design/implement the battery authentication system, with the following two core functions:

Function-I: to allow or deny a driver to drive the vehicle;
Function-II: to validate a driver's legal identity by (i) encoding his/her identity into a certain form of "authentication code", and then (ii) making the code accessible to the authentication unit for validation.

The Role-I of the battery allows to allow/deny a driver to drive a vehicle by controlling the battery's maximum power supply—the engine is not crank-able without sufficient power, as experienced in cold weather. Simply disconnecting the batteries from vehicles (e.g., with kill switches), however, is not the correct solution because batteries are needed to power vehicles' monitoring functions even when parked. The battery authentication system reduces the battery's output power to the level that supports Role-II but not Role-I, and uses the thus-enabled Role-II operations to determine whether to restore battery's output power and thus enable Role-I.

Figure 4:
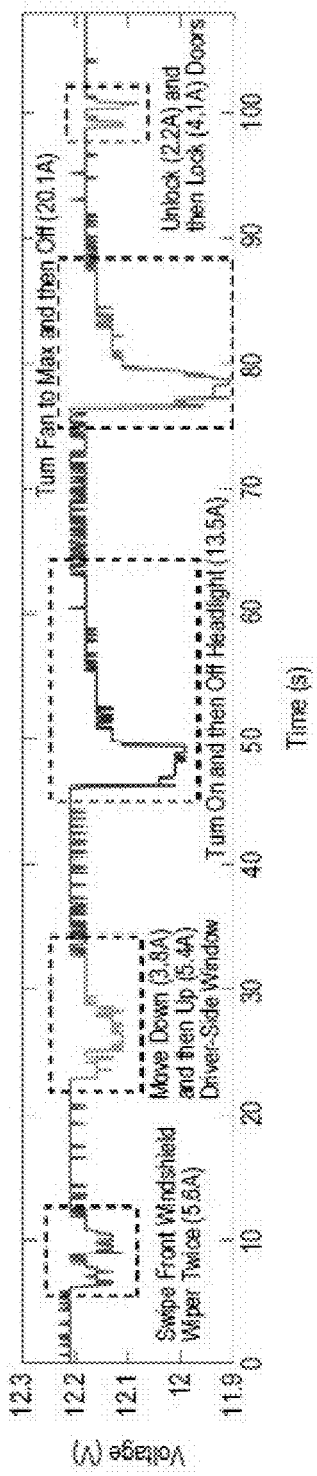
FIG. 4 is a graph showing operating a vehicle's e-systems triggers unique battery voltages, which could be used to authenticate the drivers.

The Role-II of the battery allows the system to validate a driver's identity by operating the vehicle's e-systems—i.e., using a customized sequence of e-system operations as the authentication code, which can be fingerprinted by the triggered battery voltage and thus validated at the battery side. For illustration purposes, FIG. 4 plots the voltage responses of 2018 Subaru Crosstrek's battery while performing five different e-system operations. As seen, the battery voltage drops abruptly and then gradually during the operations, and recovers and converges afterwards. The voltages are different for different operations, uncovering the possibility to fingerprint e-system operations using the triggered voltages. The five operations shown in FIG. 4 are used to elaborate on the design of the battery authentication system.

Figure 5:
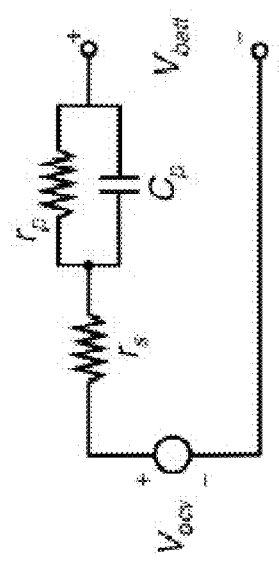
FIG. 5 is a schematic showing the battery voltages triggered by the operations of vehicle's e-systems can be explained by the battery's Thevenin model.

Referring to FIG. 5, the dependency between e-system operations and battery voltage can be explained with the battery's Thevenin circuit model. The circuit model consisting of an open-circuit voltage source $V_{OCV}$, a series resistance $r_s$, and an RC parallel network (i.e., $r_p$ and $C_p$). The battery voltage for an operation requiring discharge current $I_{DChg}$ will reduce to $$V_{batt} = V_{OCV} - r_s \cdot I_{DChg} - V_{Cp}, \qquad (1)$$

wherein $V_{Cp}$ is the voltage of the parallel capacitor $C_p$, i.e., $$\dot{V}_{Cp} = \frac{1}{r_p \cdot C_p} V_{Cp} + \frac{1}{C_p} I_{DChg}, \qquad (2)$$

and then recover to $V_{batt} = V_{OCV}$ when the discharging ends. The battery voltage will increase similarly to its charging. Eq. (1) also shows such a voltage decrease will be abrupt at first due to the instantaneous drop over $r_s$ (i.e., $r_s \cdot I_{DChg}$) and then gradual because of the slow change of $V_{Cp}$, as observed from Eq. (2) and FIG. 4. This way, the operation's discharge current (and duration) determines the resultant battery voltages, thus explaining the operation-voltage dependency.

Figure 6:
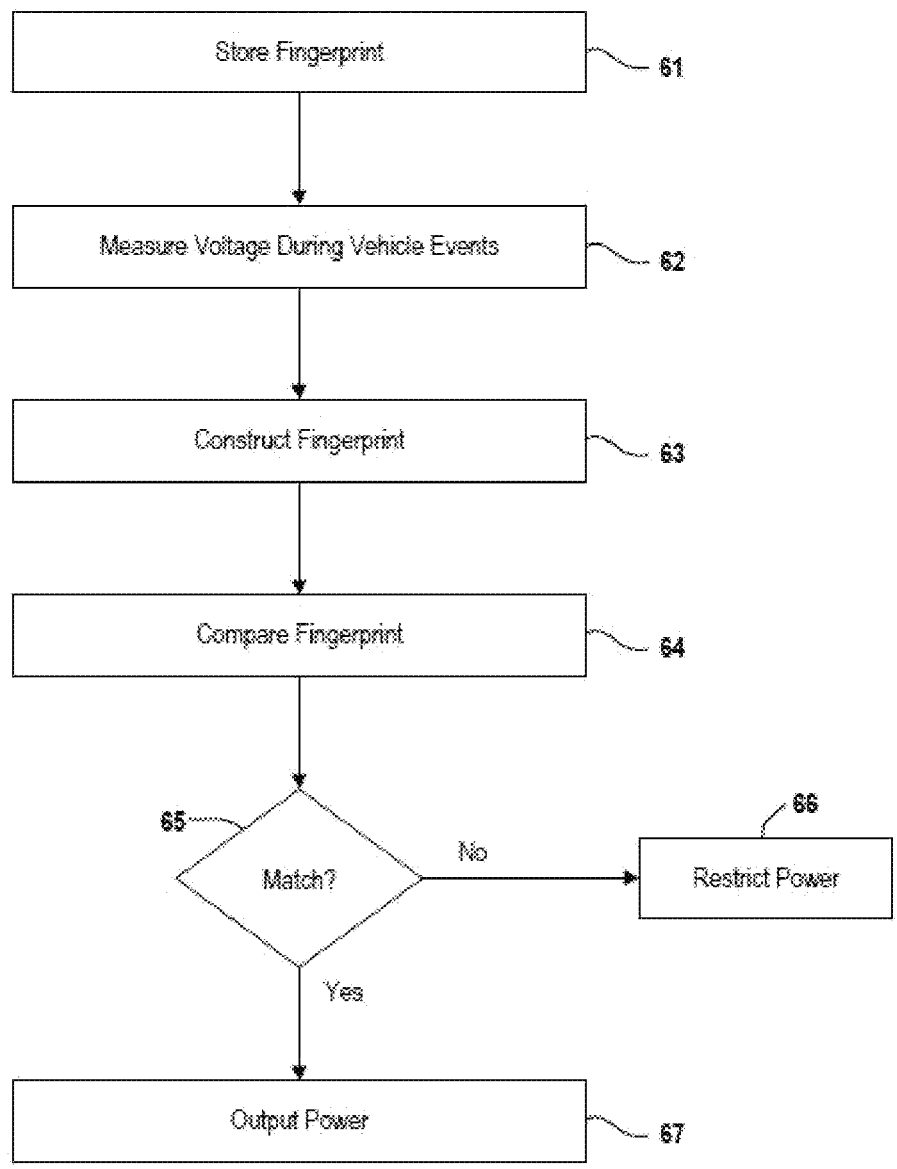
FIG. 6 is a flowchart depicting a method for controlling power output by a vehicle battery.

The battery authentication system exploits such voltage fingerprints of e-system operations (or vehicle events) to authenticate drivers with their customized authenticating operations. An overview of this method for controlling power output by a battery in a vehicle is set forth in FIG. 6. At least one fingerprint is stored at 61 by a controller in the vehicle. The fingerprint is indicative of a sequence of vehicle events and is derived from voltage measurements of the battery during a sequence of vehicle operations (i.e., customized authenticating operation). It is readily understood that the controller can store more than one fingerprint, for example, a different fingerprint for each possible approved driver of the vehicle.

Before driving the vehicle, the driver performs the sequence of vehicle operations to authenticate the driver. The system's online authentication is grounded on the assumption that intended drivers should know, and thus can perform, the customized sequence of authentication operations. During the sequence of vehicle operations, voltage of the battery is measured at 62, where the voltage measurements form a time series and each vehicle operation is powered by the battery. Example vehicle operations include but are not limited to turning on/off headlights, unlocking and locking doors, activating and deactivating windshield wipers and opening and closing a window. Note the voltage fingerprints of e-system operations is delivered from the e-systems to the battery via the vehicle's power-line network, thus allowing to authenticate drivers without requiring any wireless communications and being decoupled from the in-vehicle network. This is fundamentally different from other approaches in authenticating drivers, such as using keypad or biometric fingerprints, with which the "authenticating code" is delivered wirelessly (and thus being susceptible to cyber-attacks), or via wires (and thus requiring additional wiring inside the vehicle) to the authenticating unit—either (i) the transponder ECU or power control module as with existing key-based authentication systems or (ii) a power control module at the battery as with the proposed battery authentication system.

From the voltage measurements, an unknown fingerprint is constructed at 63, where the unknown fingerprint is indicative of the sequence of vehicle operations. Different techniques for constructing the fingerprint are contemplated by this disclosure although an example technique is further described below. The unknown fingerprint is then compared at 64 to the stored fingerprint.

After performing the sequence of vehicle operations to authenticate, the driver initiates a request to start the engine of the vehicle. In one example, the request is initiated when the driver turns the ignition switch (with a key) to a start position. In another example, the request may be initiated by pressing a key on a key fob. In any case, a start signal is received by the controller, where the start signal is a request to start the engine of the vehicle. Other methods for generating the start signal are also contemplated by this disclosure.

Upon receiving the start signal and in response to a match between the unknown fingerprint and the stored fingerprint, electric power is output from the battery as indicated at 67, for example, to an electric starter motor of the vehicle. Conversely, in response to a mismatch between the unknown fingerprint and the stored fingerprint electric power output from the battery is restricted at 66 in a manner that prevents starting the engine. It is to be understood that only the relevant steps of the methodology are discussed in relation to FIG. 6, but that other software-implemented instructions may be needed to control and manage the overall operation of the system.

The battery authentication system includes both hardware and software components. The hardware enables the battery to be in either low-power or high-power mode; whereas, the software controls the transition of battery's power mode. Specifically, the battery authentication system (i) uses a low-power mode to prevent the cranking of engine, and switches the battery to high-power mode (and thus enabling the cranking of engine) when the correct sequence of authentication operations have been observed; and (ii) keeps the battery in high-power mode until the engine stops and the vehicle is parked, at which time switches the battery to low-power mode again. The battery authentication system's software works in either an active or sleep state to improve its energy-efficiency, depending on whether or not the authentication will soon be needed.

FIG. 7A shows a block diagram of an example embodiment of the battery authentication system 70. The system 70 includes (i) a power-control module 71 regulating the battery's power mode, (ii) an alarming module 72 detecting unauthorized cranking of engine and uninstalling B-Auth from the vehicle, (iii) a voltage sensing module 73 to monitor, in real time, the battery voltage, and (iv) a microcontroller and power supply 74 to operate the above modules. In some embodiments, the term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The power-control module 71 regulates the power mode of vehicle battery using the path-switching circuit 75 shown in FIG. 7B. The path-switching circuit 75 includes a low-power path, a high-power path and a high-power path switch 78. In an example embodiment, the low-power path between the battery and vehicle, implemented with a circuit breaker 76 and a serial potentiometer 77, flows only enough current to support battery's Role-II (i.e., powering the vehicle's e-systems), but not Role-I (i.e., cranking the engine). This low-power path disconnects automatically when the current flowing through is larger than a maximum level $I_{max}$, where $I_{max}$ is sufficient to support Role-II but not Role-I. A $I_{max}$ of 50 A is used in prototyping of B-Auth, based on the empirical results show in FIG. 3. It is possible to use other advanced implementations, e.g., a MOSFET-based current limiter, to make $I_{max}$ adjustable. Note that unlike fuse, a circuit breaker can be easily reset (e.g., using a button switch) without replacing any physical component. The potentiometer is used for automatic current distribution.

With continued reference to FIG. 7B, the high-power path allows sufficient power to support battery's Role-I, which is implemented with a 6-AWG wire, as commonly used in passenger cars to connect the vehicle and battery. For the path switch, a 12V power contactor, supporting a continuous/intermittent currents of 100 A and 1000 A respectively, controls whether or not to connect the battery and vehicle with the high-power path. The contractor is operated by the controller 74 with controlling signals amplified by first a TIP120 5A transistor and then a 12V/30 A relay. Other types of switches are contemplated within the scope of this disclosure.

The system controller 74 disconnects the high-power path—i.e., connecting the vehicle and battery with solely the low-power path—by default: excessive current breaks the circuit, thus regulating the battery to the low-power mode. On the other hand, closing the high-power path, and thus connecting the two paths in parallel, allows sufficient power to support the vehicle, restoring the battery's power output and making it high-power. The battery authentication system further uses the potentiometer to eliminate the unintended disconnection of the low-power path when supporting a high-power battery. Denote $I_{total}$ as the discharge current of the high-power battery, which will be distributed automatically over the two paths according to their respective resistance:

$$I_{low} = \frac{r_{high}}{r_{low} + r_{high}} \cdot I_{total} \text{ and } I_{high} = \frac{r_{low}}{r_{low} + r_{high}} \cdot I_{total},$$

where $\{I_{low}, I_{high}\}$ are the current distributed over the low/high-power paths, and $\{r_{low}, r_{high}\}$ are their respective resistances. The controller adjusts $r_{low}$ with the potentiometer to ensure $I_{low} \leq I_{max}$, and thus the low-power path's connectivity, when supporting a high-power battery.

To corroborate the effectiveness/reliability of the power control module 71, the engine of 2008 Honda Fit is cranked with a low- and high-power battery, respectively. FIG. 8 plots the resultant battery voltage. The cranking is successful when the battery is in high-power mode, but fails with a low-power battery. Similar experiments were conducted with 2018 Subaru Crosstrek and obtained similar observations. Note the battery will be charged by the alternator upon successful cranking, thus raising its voltage to FIG. 9 plots the current flow on the low/high-power paths when cranking the engine successfully, showing the low-power path flowed only a small (and adjustable with the potentiometer) portion of the total current, thus validating the system's ability of keeping the low-power path connected when supporting a high-power battery.

Referring to FIG. 7C, the alarming module 72 detects two illegal operations: (i) cranking the engine with a low-power battery, and (ii) uninstalling the system physically from the vehicle, both of which are signs of theft attempt. Both these illegal operations will disconnect the circuit between the vehicle and battery, inspiring the system to detect them by (i) sending a periodic current pule $I_{pulse}$ to the aliveness detection resistor $R_{aliveness}$ in FIG. 7C, and (ii) monitoring the resultant voltage drop over $R_{aliveness}$. The system will observe $V_{aliveness} = I_{pulse} \cdot R_{aliveness}$ if the circuit between the vehicle and battery is connected, and $V_{aliveness} = 0$ otherwise, in which case the alarming module triggers its alarm, such as an audible or visible alert.

With this alarming module 72, the only theoretically feasible way to undo the system's theft prevention without triggering the alarm is to (i) install a second battery to the vehicle while keeping the connections among the original battery, the system, and the vehicle intact, thus setting up a parallel connection of the two batteries, and then (ii) tune the voltage of the second battery carefully based on the original battery's voltage, the current of cranking engine, and the maximum current $I_{max}$ of the system's low-power path, to ensure the original battery supplies only current less than $I_{max}$ when cranking the engine. These requirements, together with the limited space of engine compartment—i.e., the hood may not close after installing the second battery and thus difficult/dangerous to drive the vehicle—make the theoretical way of voiding an alarm practically infeasible.

In the example embodiment, the system further includes: (i) a voltage sensor 73 to monitor, in real time, battery voltage; (ii) an Arduino-based controller 74, and (iii) a 9V battery as the power supply. Note using the vehicle battery to power the system is not reliable, due to the system's constant operation (and thus power consumption) even when the car is parked, jeopardizing the vehicle battery's ability to crank the engine.

In other embodiments, the battery authentication system 70 may include an input device interfaced with the vehicle battery. The input device may include one or more buttons which can be actuated by the driver of the vehicle. Each button is design to discharge the battery, such that the magnitude of the battery voltage differs over time for each button. In addition to or as an alternative to the vehicle events described herein, the buttons of the input device may be used by the driver to generate a sequence of vehicle events which are used to form a fingerprint. It is envisioned that the input device may be an add on module which, for example plugs into a power outlet of the vehicle or is integrated into the vehicle by the OEM.

Figure 10:
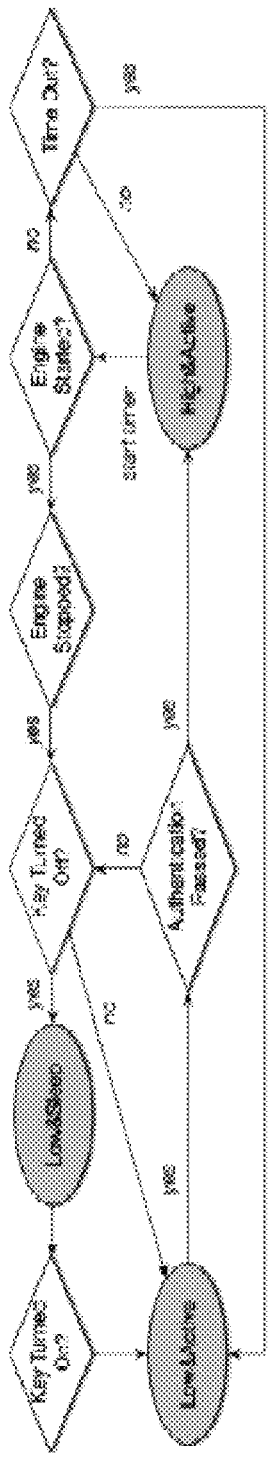
FIG. 10 is a control flow diagram for the system with low/high power states for hardware and sleep/active states for software.
Figure 11:
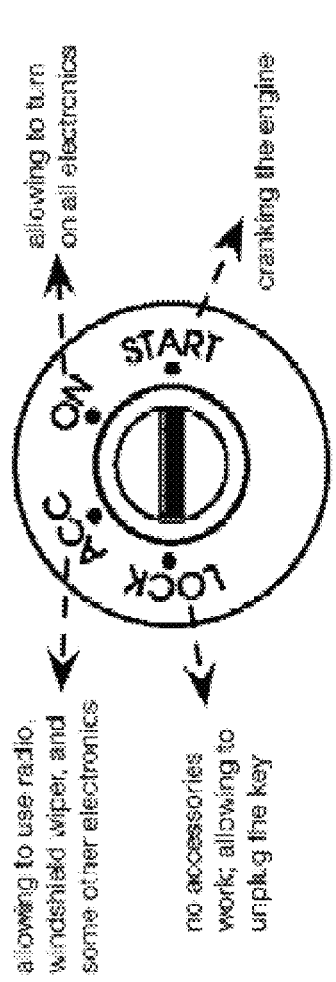
FIG. 11 is a diagram showing ignition positions of keys.

Software implemented by the controller 74 reads and exploits the battery voltage in real time to authenticate the driver, and then controls the battery's power mode based on the authentication result. FIG. 10 summarizes the system's control flow in the example embodiment. The control flow includes five key components: detecting the turning-on/off of ignition key, authenticating a driver by matching the real-time voltage readings with the customized voltage fingerprint, and detecting the cranking/stopping of engine. The turning-on/off of ignition key is defined as turning the key to the ignition position ON/LOCK, as illustrated in FIG. 11. For vehicles with key-fobs, these two events correspond to the cases when the key-fob enters/leaves the vehicle's proximity.

Control flow transits between the sleep and active states based on the events of turning on/off the ignition key. The system operates in the sleep state 101 (i.e., sampling the voltage at a lower rate of, say, 1 Hz) by default to reduce its energy consumption, and switches to active 102 (i.e., sampling the voltage at a higher rate of, say, 10 Hz) only when a driver authentication is needed, which is, in turn, determined based on the events of turning on/off the ignition key: (i) turning on the ignition key indicates that the authentication will soon be needed, at which time the system becomes active to monitor the battery voltage closely; (ii) turning off the ignition key indicates that the vehicle has been parked and the authentication may not be needed soon, and thus the system returns to sleep state 101 to reduce its energy consumption. It is possible to predict when the vehicle will be driven based on its driving history and use the prediction to control the active/sleep states.

Upon becoming active, the system will attempt to authenticate the driver by matching the real-time voltage readings with the a priori customized voltage fingerprint. The battery authentication system establishes an authenticated session with the driver if such a voltage matching is successful, and switches the battery to the high-power mode.

The battery authentication system 70 determines when to switch the battery back to the low-power mode based on the events of cranking/stopping the engine. Specifically, the above-established authenticated session ends, and thus the system switches the battery back to the low-power mode, if (i) the engine is not cranked soon enough (e.g., within 5 minutes) after the session began, or (ii) the engine is cranked and then stopped after driving. Note that the system resides in high-power mode while driving, ensuring the charging power from the alternator can be safely absorbed.

Detection of vehicle events is further described. As stated above, the system operation is steered by four vehicle events: turning-on/off the ignition key and cranking/stopping the engine. The system detects the events based on both their individual voltage patterns and sequential dependencies.

Figure 12:
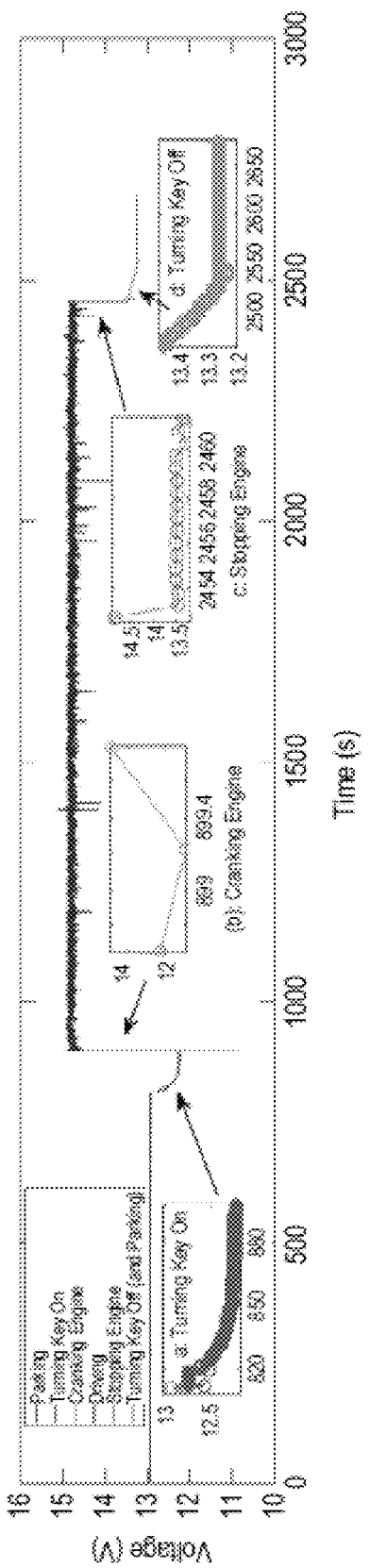
FIG. 12 is a graph showing system operation steered by four vehicle events, turning on/off the ignition key and cranking/stopping the engine.
Figure 13:
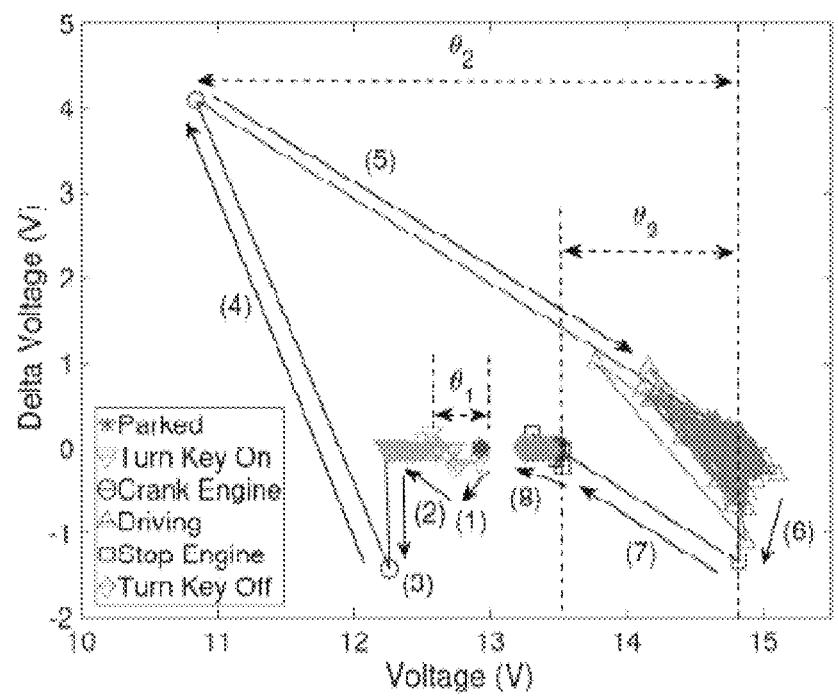
FIG. 13 is a graph showing a transformed plot of FIG. 12, where the x-axis is the voltage reading and y-axis is the change between two consecutive voltage readings, i.e., the markers are defined as (v(t), v(t+Δt)−v(t)).

More specifically, the battery authentication system 70 detects events by recognizing the voltage patterns of individual events. FIG. 12 plots a 45-min voltage trace of 2018 Subaru Crosstrek (collected at 2 Hz), covering a full usage cycle of the vehicle, i.e., parked, started, driven, and then parked again. A transformed plot of this voltage trace is shown in FIG. 13, where the x-axis is the voltage reading v(t) and the y-axis is the change between two consecutive voltage readings, i.e., the markers in FIG. 13 are defined as $$\mathbb{X} = \{x(t)\} = \{v(t)\}, \quad (3)$$

$$\mathbb{Y} = \{y(t)\} = \{v(t+\Delta t) - v(t)\}, \quad (4)$$

and $\Delta t$ is the sampling interval. This way, one can clearly observe the vehicle's usage cycle—including all the four to-be-detected vehicle events—from the transitions of marks in FIG. 13. Also, FIG. 12 shows the battery voltage with the engine running (and hence the battery being charged) is much higher than that with the engine off, demonstrating one can determine whether the engine is running or not based on battery voltage, especially in view of the standard voltage range with the engine running (i.e., [13.7, 15]V). For a voltage reading v, let $v \in \mathbb{O}$ denote if v is collected with the engine running, and $v \notin \mathbb{O}$ otherwise.

In the example embodiment, the battery authentication system detects the four events based on $\{\mathbb{X}, \mathbb{Y}\}$ using a moving time window of size w. For each window $[t_0, t_0+w]$, the system (i) identifies the max/min voltage readings in the window (i.e., $v_{max}$ at $t_{max}$ and $v_{min}$ at $t_{min}$), (ii) calculates:

$$m_1 = \text{mean}\{v(t_0):v(\min\{t_{min},t_{max}\})\}, \quad (5)$$

$$m_2 = \text{mean}\{v(\max\{t_{min},t_{max}\}):v(t_0+w)\}, \quad (6)$$

$$m_3 = \text{mean}\{y(t_0):y(t_0+w)\}, \quad (7)$$

and then (iii) detects the four events using $\{v_{max}, v_{min}, m_1, m_2, m_3\}$.

The battery authentication system 70 detects the event of turning on the key based on two observations: (i) the voltage is relatively stable before turning on the key (i.e., when the vehicle is parked); (ii) the voltage drops instantly and then decreases gradually when/after the key is turned on because of activated vehicle modules, such as ABS, airbag, etc. These voltage patterns can be observed in FIG. 12 and transitions (1) and (2) of FIG. 13. Thus, the battery authentication system 70 concludes the detection of the event of turning on key when $v_{max} \notin \mathbb{O}$ and $v_{max} - v_{min} > \theta_1$ are observed, where $\theta_1$ captures the instant voltage drop when the ignition key is turned on (See FIG. 13). The system configures $\theta_1$ during its initialization based on the voltages observed from the vehicle/battery-of-interest, and updates $\theta_1$ later during its online authentication, as described below. The battery voltage converges after the key is turned off (see FIG. 12 and transition of FIG. 13), helping the system conclude the key is turned off if $m_3=0$ is observed.

Battery voltage drops significantly when the engine is cranked, and then returns to a higher-than-before level, as shown in FIG. 12 and transitions (3)-(5) of FIG. 13. The large voltage drop is because the starter motor requires a large discharging power/current from the battery to start the engine. The alternator then generates power from the engine's rotation, which, in turn, charges the battery and thus restores the battery voltage. Also, battery voltage drops significantly when the engine is stopped, and then stays at low levels, due to the termination of charging current (see FIG. 12) and transitions (6) and (7) of FIG. 13 Based on these observations, the system concludes (i) the engine is cranked if $v_{max} - v_{min} > \theta_2$, and (ii) a running engine is stopped if $v_{max} \in \mathbb{O}$ and $\theta_3 < m_1 - m_2 < \theta_2$. Again, FIG. 13 illustrates $\theta_2$ and $\theta_3$, both of which can be configured at the initialization of the battery authentication system and then updated online.

More advanced pattern recognition methods could be used to detect these vehicle events based on battery voltage. The above methods are used because of their (i) simplicity, which is crucial for the system to detect the events in real time, and (ii) empirically validated accuracy, as shown below.

Figure 14:
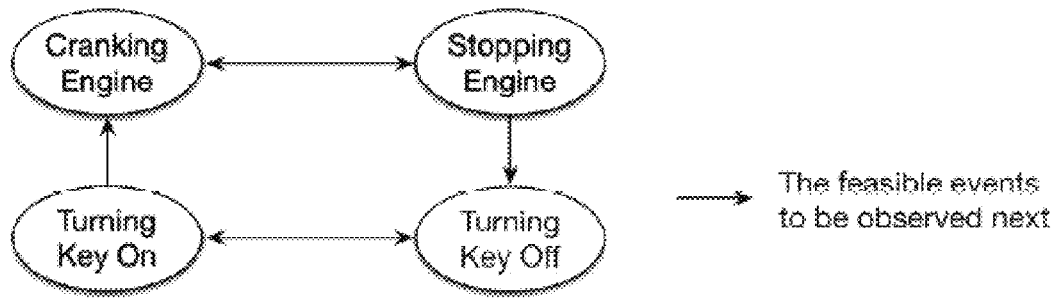
FIG. 14 is a diagram showing how four vehicle events have sequential dependencies.

Besides the voltage patterns of individual events, the battery authentication system also exploits the four events' sequential dependencies—e.g., it is impossible to turn off the key after cranking the engine, without stopping the engine first—to improve their detections, as summarized in FIG. 14. Given the previously-detected event, these dependencies define the feasible events to be observed next, thus not only improving the accuracy of system's detection of events, but also reducing complexity, i.e., only the feasible events need to be examined.

Upon detection of the event of turning on the ignition key, the battery authentication system becomes active to monitor the battery voltage at a high rate, and checks if the voltage fingerprint of customized authenticating operations has been observed. Let $\mathbb{F} = \{f_1, f_2, \ldots, f_n\}$ be the customized voltage fingerprint, and $\mathbb{U} = \{u(t)\}$ be the voltage readings after the ignition key is turned on.

Intuitively, the battery authentication system 70 attempts the voltage matching only when the driver has finished his/her authenticating operations, which can be inferred from the received and then converged battery voltage (see FIG. 4). This steers the extraction of $\mathbb{U}$'s sub-traces to match $\mathbb{F}$. The battery voltage, however, fluctuates significantly during its convergence, as shown in FIG. 15A with the voltage after swiping-the-front-windshield-wiper-twice as an example. Such fluctuations are caused by both the background operations of vehicle's e-systems and the granularity of voltage sensing (e.g., 20 Mv in FIG. 15), signifying the noises during the converging process. The fact that these fluctuations are of a much higher frequency than e-system operations inspires the system to remove them with a low-pass filter, as shown in FIG. 15B after applying a 4 Hz low-pass filter to the raw readings in FIG. 15A. The system smooths the filtered voltage readings further with a moving average, and then records the time instants at which identical (or close enough) voltage readings have been observed consecutively (e.g., for 5 times), denoted as $\mathbb{T} = \{t_1, t_2, \ldots\}$. At each $t_i \in \mathbb{T}$, the system extracts recursively a voltage sub-trace:

$$\mathbb{U}_{j;i} = \{u(t_j), \ldots, u(t_i)\} (j = i-1, i-2, \ldots, 1), \quad (8)$$

and attempts to match $\mathbb{U}_{j;i}$ with $\mathbb{F}$ until (i) a match is concluded, or (ii) j reduces to 1, thus concluding a failed matching attempt at time $t_i$. Clearly, one can reduce the search space of j, and hence the complexity, to extract only $\mathbb{U}$'s sub-traces with durations similar to $\mathbb{F}$, as in prototyping of the system.

Next, how the battery authentication system determines if a given $\mathbb{U}_{j;i}$ matches $\mathbb{F}$ is described, which is non-trivial because the voltages of even the same operation may vary in their absolute/relative levels and durations. First, background operations of vehicle's e-systems lower the absolute levels of battery voltage. FIG. 16 plots the voltage readings after turning on the ignition key of 2018 Crosstrek, with different (but typical) background operations of e-systems, i.e., with all (or whichever possible more specifically) e-systems off, with the headlight on, and with both the headlight and fan on, showing clearly reduced voltage levels with more intensive background operations. Also, without further e-system operations, the battery voltage will stabilize after turning on the ignition key. These observations require/inspire the system to align $\mathbb{U}_{j;i}$ and $\mathbb{F}$, respectively, with their first voltage readings, i.e., $u(t_j)$ and $f_1$, according to $$\mathbb{U}'_{j;i} = \{u(t_k) - u(t_j)\} (k = j, j+1, \ldots, i), \quad (9)$$

$$\mathbb{F}' = \{f_k - f_1\} (k = 1, 2, \ldots, n) \quad (10)$$

and examine the similarity between $\mathbb{U}'_{j;i}$ and $\mathbb{F}'$.

Figure 17:
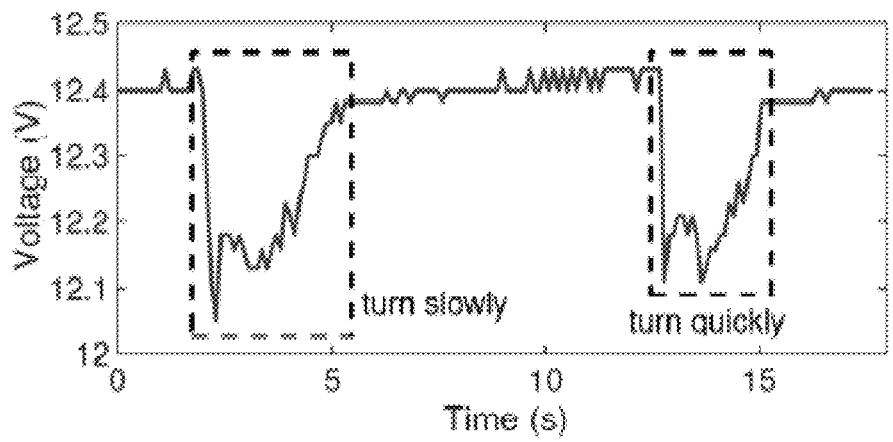
FIG. 17 is a graph showing how the same operation may generate different voltage responses.
Figure 18:
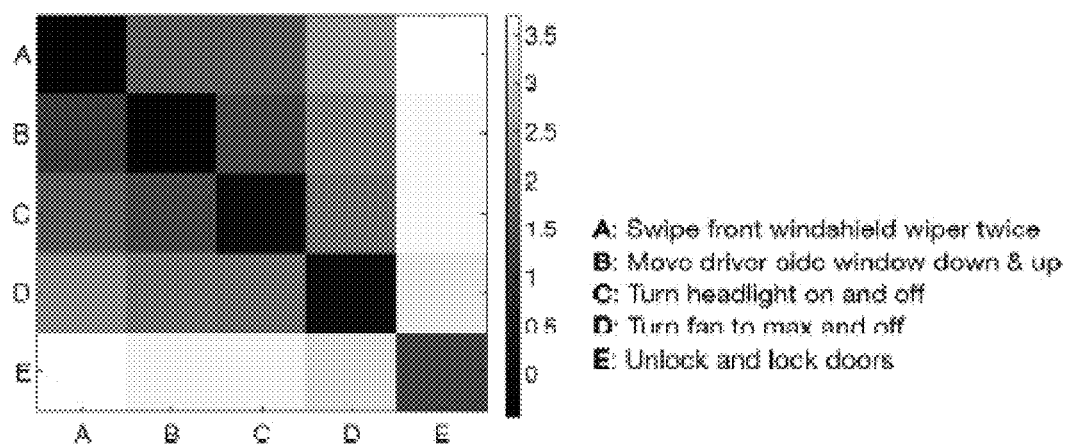
FIG. 18 shows the log-scale warp distances between the voltage response of the five operations in FIG. 4.

Also, both the relative levels of voltage readings and their durations may vary for the same operation, due to the difficulty in repeating certain e-system operations exactly every time. FIG. 17 compares the voltage responses when the vehicle's air conditioner is turned on to the maximum intensity and then turned off, with different speeds by rotating the speed dial: a slower operation increases both the magnitude and duration of the triggered voltage responses. In one example embodiment, the system mitigates these voltage dynamics by using dynamic time warping (DTW)—a method measuring the similarity of time series with their warp distance—to quantify the similarity $\mathbb{U}'_{j;i}$ and $\mathbb{F}'$. FIG. 18 compares the warp distances (in log-scale) between the voltage responses of the five operations in FIG. 4. The fact that the minimum warp distance is always achieved between voltage responses of the same operation validates the effectivness of the system's use of DTW. This way, the system quantifies the similarity between $\mathbb{U}'_{j;i}$ and $\mathbb{F}'$ with their normalized warp distance:

$$\|\mathbb{U}_{j;i}, \mathbb{F}\|_{B-Auth} = \frac{\|\mathbb{U}'_{j;i}, \mathbb{F}'\|_{dtw}}{\min\{i - j + 1, n\}}, \quad (11)$$

and a match is concluded if $$\|\mathbb{U}_{j;i}, \mathbb{F}\|_{B-Auth} < \eta. \quad (12)$$

$\eta = 2 \cdot \Delta v$ is used in the prototype of B-Auth, where $\Delta v = 20$ mV is the granularity of voltage sensing.

The battery voltage changes gradually over time (due to aging), e.g., all of $\{r_s, r_p, C_p\}$ in FIG. 5 change over time, exhibiting their dynamics. The system mitigates such voltage dynamics by updating the voltage fingerprint after each successful online matching of voltages. Specifically, after concluding $\mathbb{U}_{j;i}$ matches $\mathbb{F}$, the system updates $\mathbb{F}$ using the DTW barycenter average (DBA)—a method to identify the optimal average of multiple time-series—according to:

$$\mathbb{F} = DBA(\mathbb{F}, \mathbb{U}_{j;i}). \quad (13)$$

Figure 19:
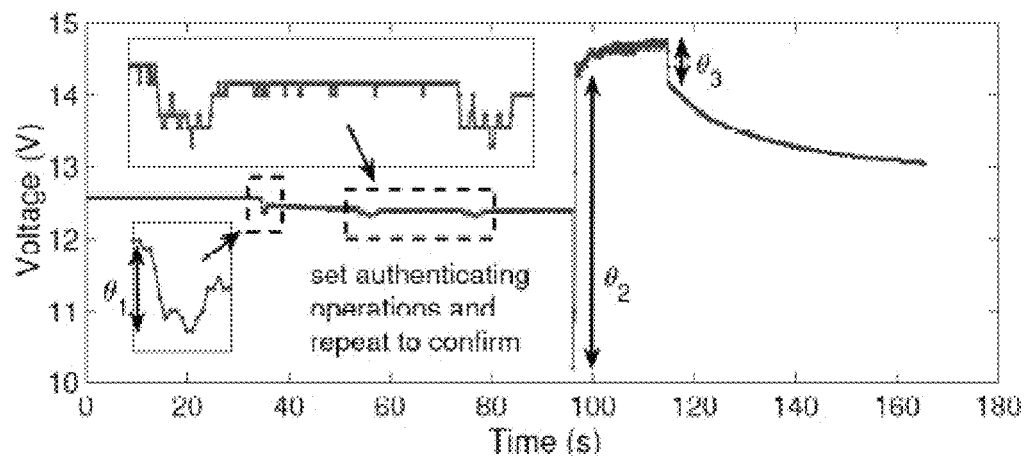
FIG. 19 is a graph showing initializing the system on 2008 Fit with the authenticating operation of swiping-the-front-windshield-wiper-twice.

Implementations details for an example embodiment of the battery authentication system 70 is described below. After its installation in a vehicle, the system keeps the battery in the high-power mode by closing the switch, and prompts the driver to perform a full cycle of the vehicle's usual operations, i.e., turning on the ignition key, performing his/her customized authenticating operations twice, cranking and then stopping the engine, and finally turning off the key. The system monitors/records the battery voltage during these initialization operations, and uses them to (i) construct the voltage fingerprint of users' authenticating operations using Eq. (13), and (ii) configure the control parameters—i.e., $\{\theta_1, \theta_2, \theta_3\}$—for the vehicle to be protected from theft. FIG. 19 plots the recorded voltages during the initialization of the system with the authenticating operation of swiping-the front-windshield-wiper-twice. The system stores the constructed voltage fingerprint of authenticating operations, together with the configured parameters, in the non-volatile EEPROM of its controller. These parameters can be updated online to reflect the changes of battery voltage dynamics due to aging.

A simple system reset function is implemented, i.e., by pressing a reset button for 20 s, to re-initialize the system, if/when necessary (e.g., in case the driver forgets his/her customized operations). Securer interfaces to system's hardware could be added, such as keypad, to reset the system.

As proof of concept, the battery authentication system 70 has been evaluated with two vehicles—2018 Subaru Crosstrek and 2008 Honda Fit—using both trace-driven validation and real-lift field-tests. The individual components of the system, have been evaluated—i.e., detecting vehicle events and matching voltages—with empirical traces collected from the two vehicles.

Figure 20A:
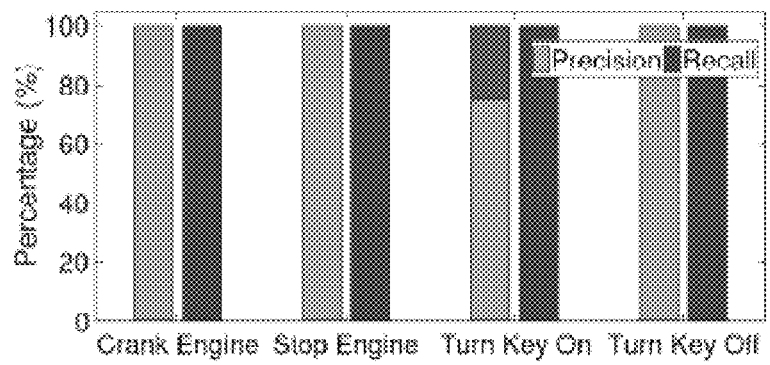
FIG. 20A is a graph showing detection accuracy of the system in Crosstrek.
Figure 20B:
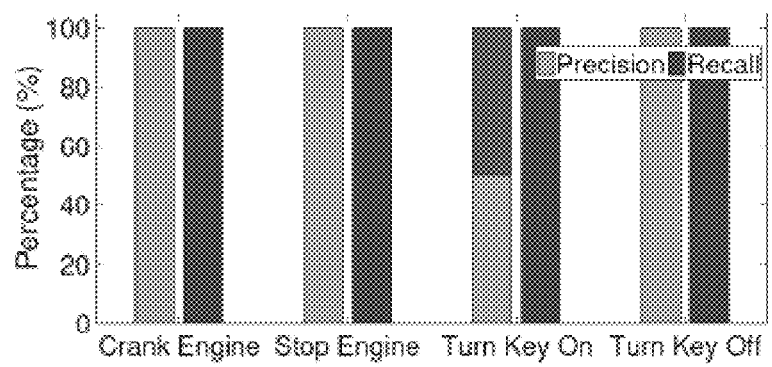
FIG. 20B is a graph showing detection accuracy of the system in Fit.
Figure 20C:
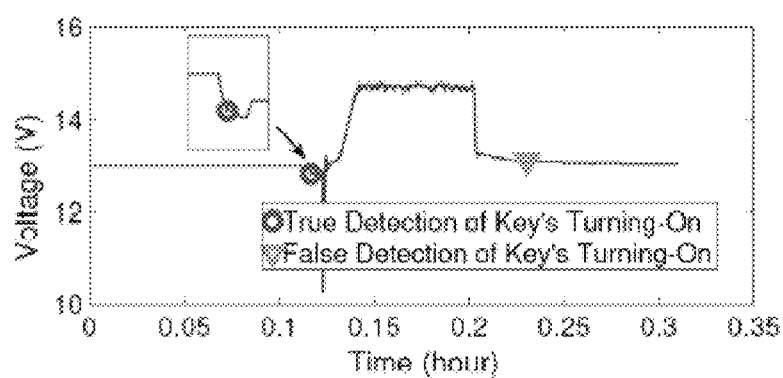
FIG. 20C is a graph showing false detection based only on voltages.

To examine the system's accuracy in detecting the vehicle events of turning on/off ignition key and cranking/stopping engine, 10 times the operations of (i) plugging in the key, (ii)

turning on the key, (iii) cranking the engine, (iv) stopping the engine, (v) turning off the ignition key, and then (vi) unplugging the ignition key in the two vehicles, respectively, is repeated. The battery voltages are recorded during these operations, and then detected using the system. FIGS. 20A and 20B plot the detection results, showing the system's 100% precision and recall in detecting all these events in both vehicles. Note that the system achieves 75% and 50% precision when only battery voltage is used to detect the event of turning on key in the two vehicles, showing non-negligible false detections. Examining the voltage traces closely reveals the cause of false detections to be the similarity between the voltage behavior after stopping the engine and that after turning on key, i.e., the voltage drops quickly and then decreases slowly in both cases (but with different magnitudes), as shown in FIG. 20C. These false detections can be removed effectively by incorporating the sequential dependency of the events (see FIG. 14) into the system, achieving 100% precision eventually.

Figure 21:
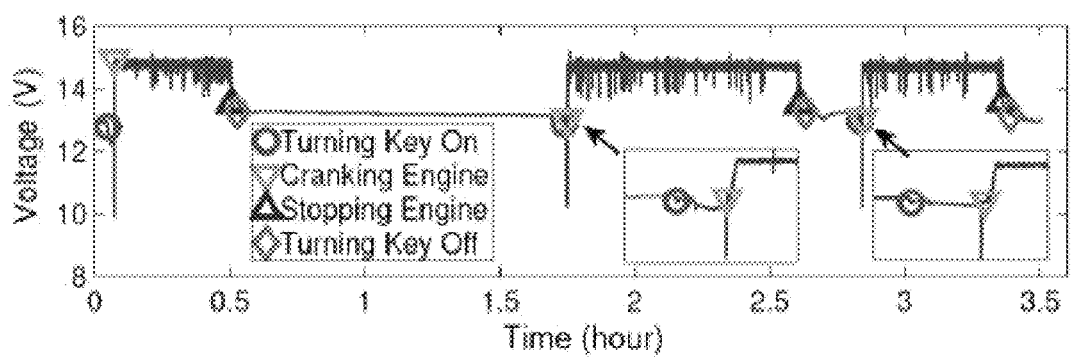
FIG. 21 is a graph showing real-life driving traces of 2018 Crosstrek validate the system's ability to detect the 4 events with 100% precision/recall.

To further validate the system's ability to detect events, 3 voltage traces of the Crosstrek's battery were collected during its daily usage, covering a period of 73 hours cumulatively. The vehicle is started (and then driven) 9 times during this data-collection campaign. Again, applying the system's event detection to these real-life driving traces shows the system to detect the four events with 100% prevision and recall. FIG. 21 plots one of the exemplary voltage traces, with the events detected highlighted.

Figure 22A:
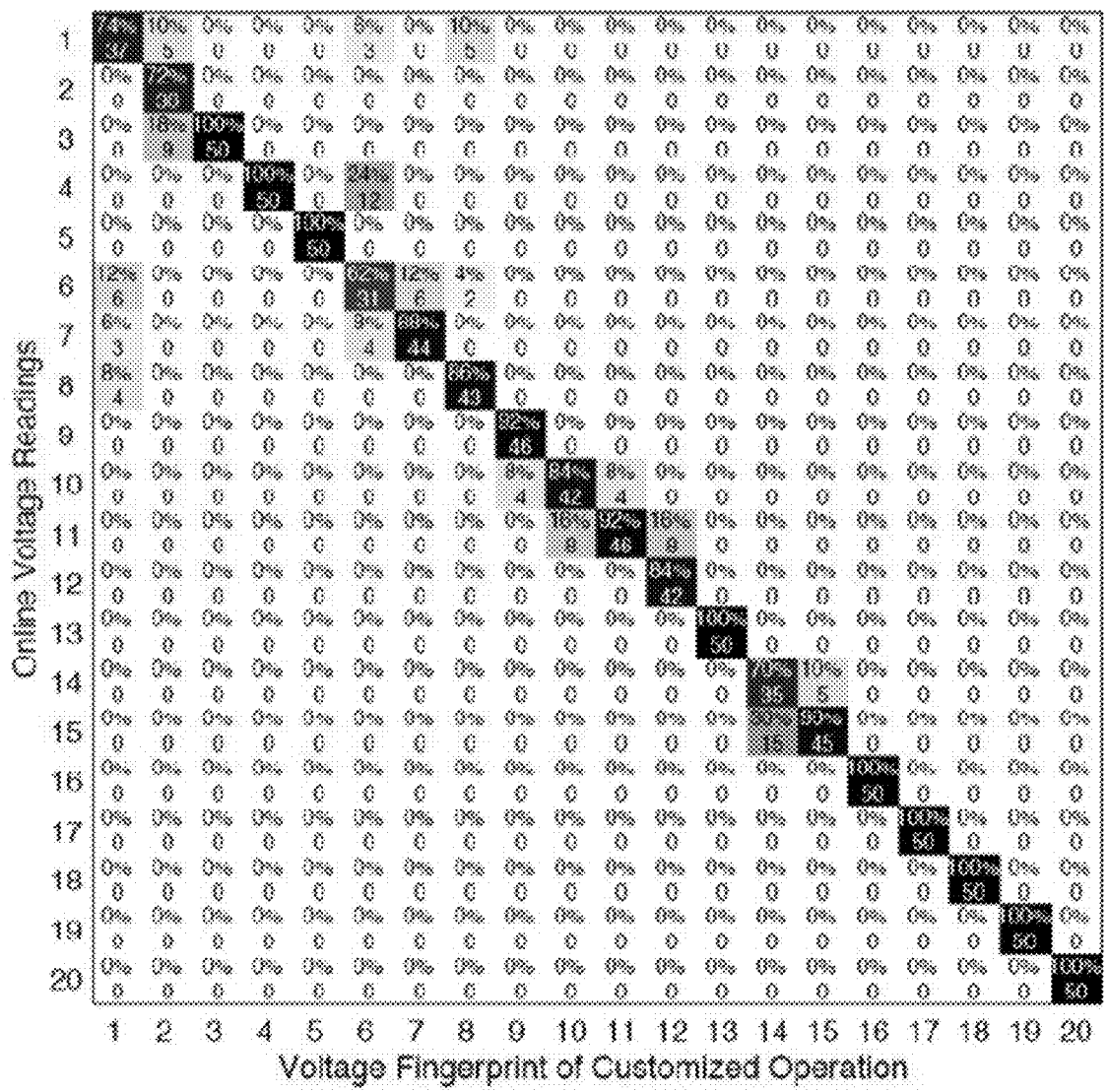
FIGS. 22A and 22B shows the system's voltage matching achieves 90+% precision/recall/F1-score with both 2018 Crosstrek and 2008 Fit, respectively.
Figure 22B:
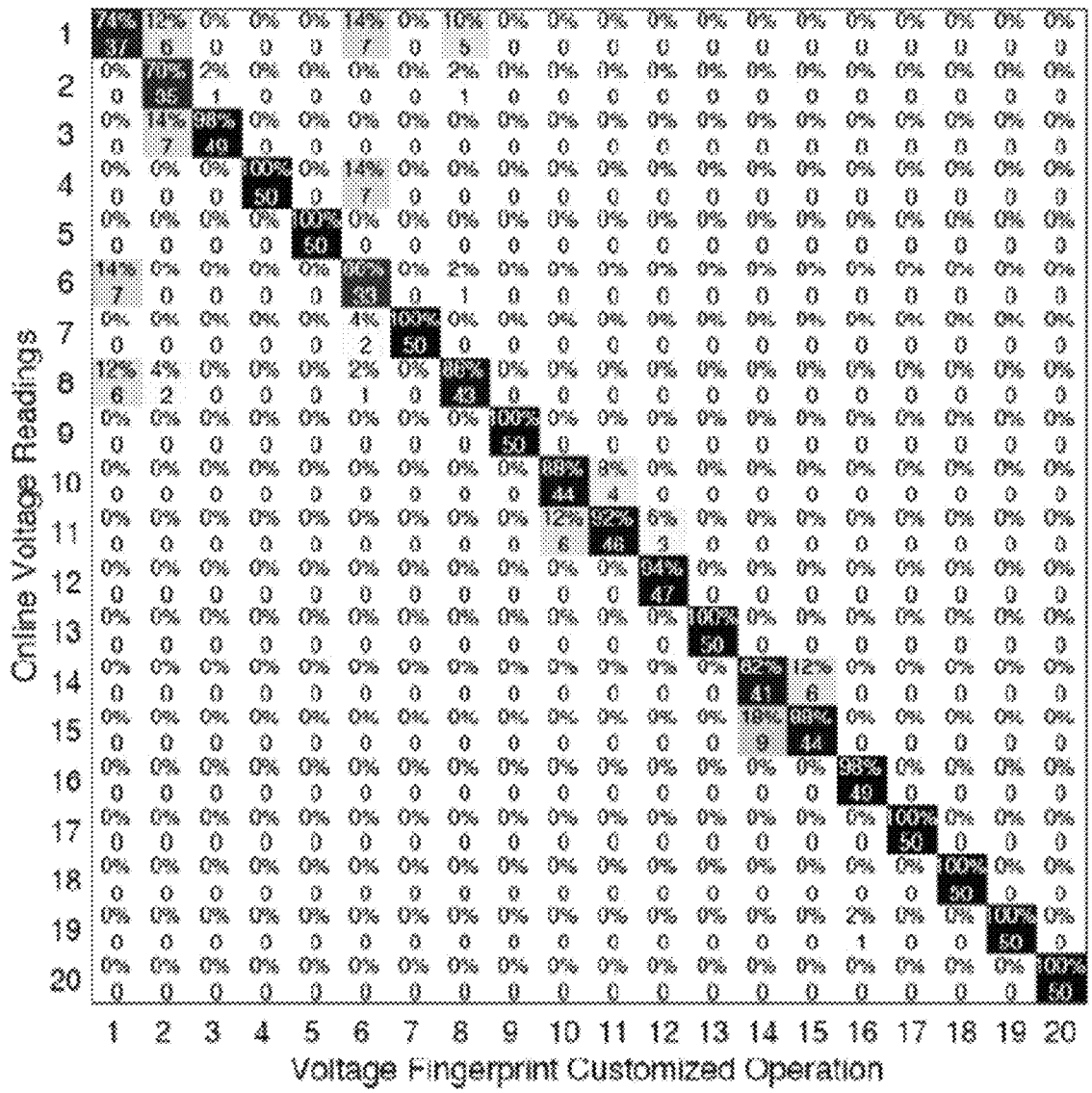

To validate the system's accuracy in matching online voltages with the voltage fingerprint of customized authenticating operations, the voltage responses were collected to 20 different authenticating operations in the two evaluation vehicles, each repeated 10-65 times. These voltage responses are used to evaluate the system's voltage matching via cross-validation. Specifically, for each customized authenticating operation in Table 2, (i) randomly selected 2 responses as the voltage fingerprint of the operation, (ii) selected 5 voltage responses for each operation as the voltages observed online, and then (iii) examined if these online voltages are "matched" with the fingerprints of the authenticating operation. This process was repeated 10 times for each operation. FIGS. 22A and 22B summarize the matching results in terms of the number of concluded matches for each pair of operations and the corresponding % of the total number of trials (10×5=50), i.e., each column in FIG. 22 adds up to be 50 (or 100%). For 2018 Crosstrek, the {1st, 2nd, 3rd} quartiles of the voltage matching precision, recall, and F1 score are {87%, 96%, 100%}, {85%, 95%, 100%}, and {86%, 94%, 100%}, respectively. The quartiles of precision, recall, and F1-score obtained from 2008 Fit are {87%, 98%, 100%}, {86%, 95%, 100%}, {85%, 96%, 100%}.

Figure 23:
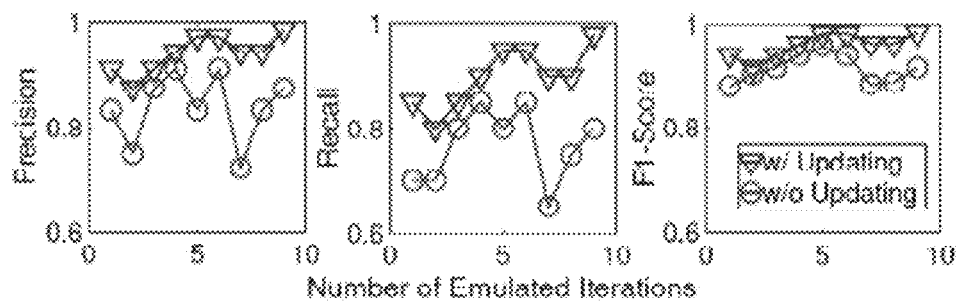
FIG. 23 shows system's online update of fingerprints improves the voltage matching with both higher accuracy and lower variance.

Real-life usage is further emulated with these empirical voltage responses to validate the system's online updates of the voltage fingerprint. The real-life usage of the system is emulated by (i) randomly selecting 10 voltage responses to each operation, (ii) generating 20 random permutations of these 10 voltage responses, and (iii) emulating the system's real-life usage with each of these permutations by using the first response as the initialized fingerprints, and the next 10−1=9 responses as the voltages subsequently observed online. FIG. 23 plots the system's accuracy in matching the voltages during the emulated period, with and without updating the fingerprint, averaged over these 20 operations. The accuracy of voltage matching fluctuates significantly without updating the fingerprint, which can be mitigated well if the fingerprint is updated online.

After the validation of individual components using empirical traces, the system's end-to-end performance is evaluated in authenticating drivers in the field.

After installing the battery authentication system on the two evaluation vehicles, it is initialized with each of authenticating operations.

Figure 24A:
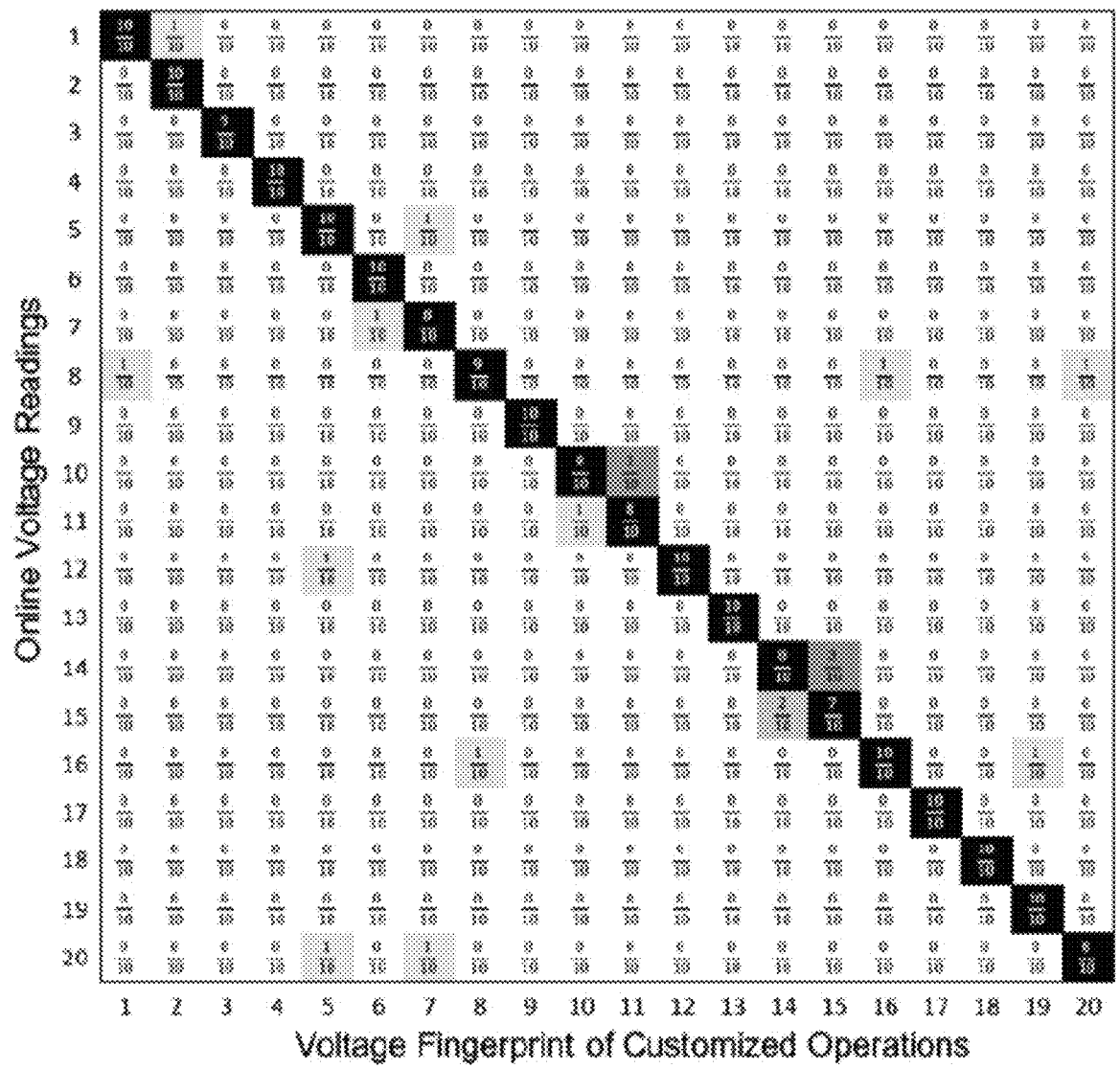
FIGS. 24A and 24B are graphs showing field-tests of system on Crosstrek and Fit (91%, 90%) precision, (93%, 92%) recall, and (92%, 91%) F1-score in recognizing the authenticating operations, where the field-test nature of these results makes the columns not necessarily add up to 1.
Figure 24B:
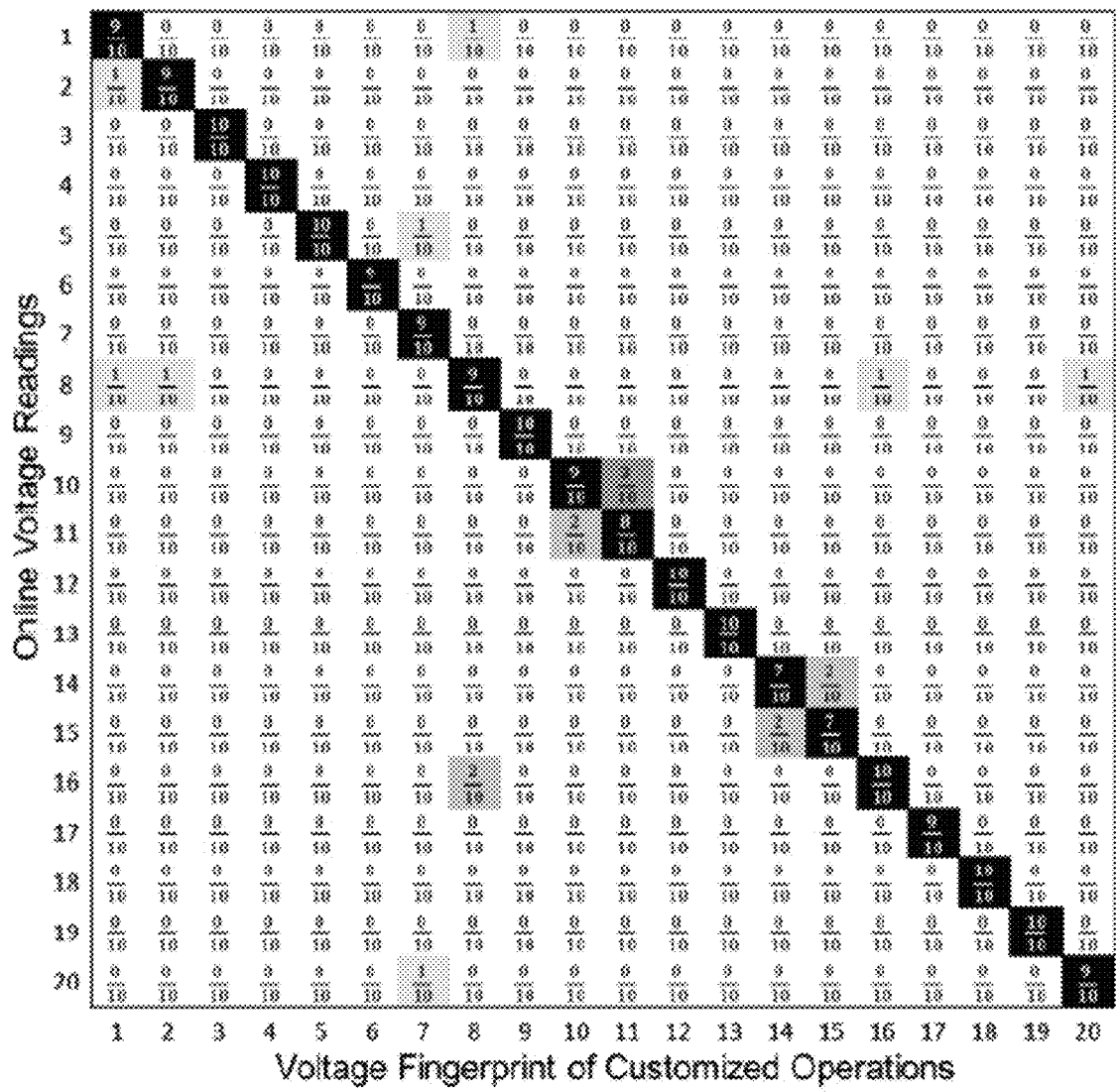

After each initialization, it is repeated 10 times (i) the customized authenticating operations to validate the system's ability of identifying the correct operations, and hence authenticating the driver, and (ii) other operations to validate the system's ability of differentiating different operations, and thus thwarting theft attempts. An active buzzer is used to "learn" the matching results, i.e., activate the buzzer when the system concludes a match. FIGS. 24A and 24B summarize the in-field test results with the two vehicles, showing the system's identification of correct authentication operations with an average precision/recall/F1-score of {91%, 93%, 92%} and {90%, 92%, 91%} for Crosstrek and Fit, respectively. Note that in this experimentation—repeating 10 times each of the operations for every customized operation—the columns of FIG. 24 do not necessarily add up to 1.

Figure 25A:
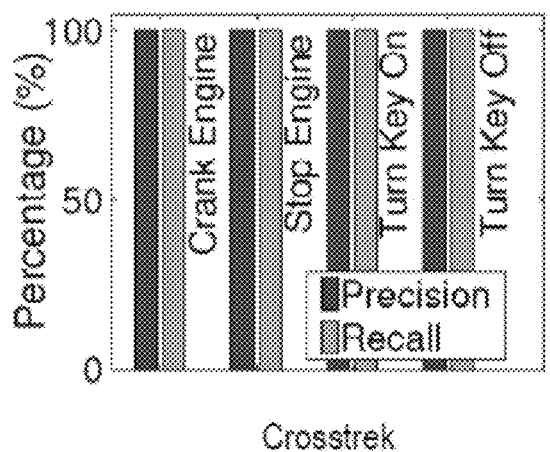
FIGS. 25A and 25B are graphs showing field-tests confirms system's detection of vehicle events with 100% accuracy.
Figure 25B:
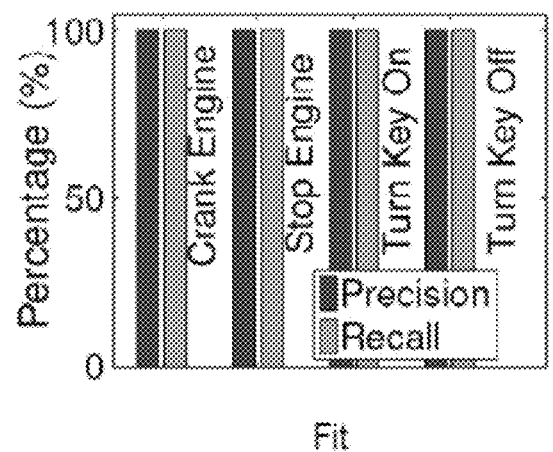

The battery authentication system's accuracy has also been evaluated in detecting the vehicle events by repeating 20 times the operations of turning on/off the ignition key and cranking/stopping the engine. Again, to observe/learn the detection results, the buzzer is activated for {1,2,3,4}s when the events of turning on key, turning off key, cranking engine, and stopping engine are detected, respectively. FIGS. 25A and 25B summarize the detection results, showing the system's ability to detect these events with 100% accuracy in both precision and recall.

The system's reliability has also been validated in dis/enabling the starter by controlling the battery's power mode. Ten attempts were made to crank the engine in low- and high battery mode, respectively, for both Crosstrek and Fit. All these attempts with low-power battery failed and those with high-power battery succeeded, thus exhibiting the system's 100% reliability in dis/enabling the cranking of engine.

Figure 26:
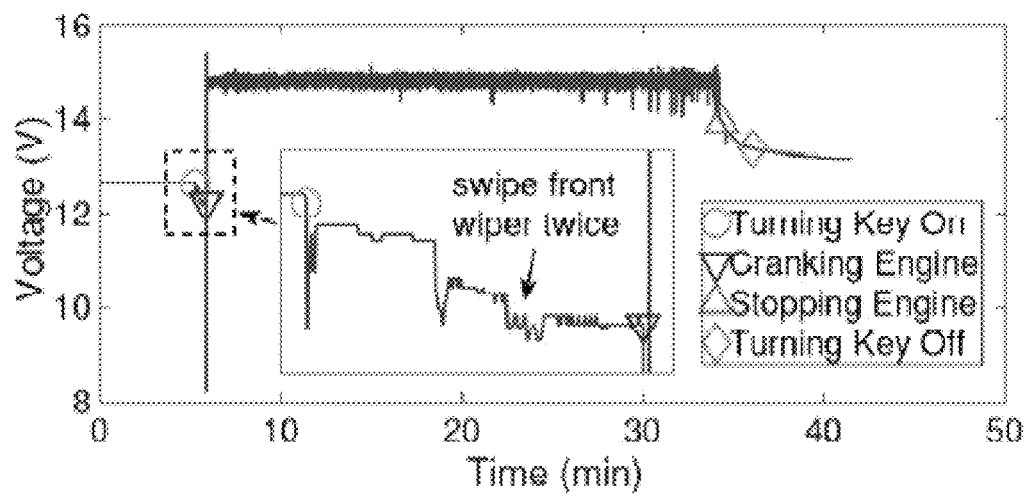
FIG. 26 is a graph showing a voltage trace taken while using the battery authentication system in real life.

The battery authentication system has also been evaluated while driving Fit, i.e., in a real-life setting. FIG. 26 plots the battery voltage when the Fit is parked, started, driven, stopped, and parked again, with a particular authenticating operation. The time instants at which the events of turning on/off the ignition key and cranking/stopping the engine are also labelled. The system accurately recognized the authenticating operation, enabled the high-power mode of battery, and then switched the battery back to low-power mode after turning off the ignition key.

Figure 27:
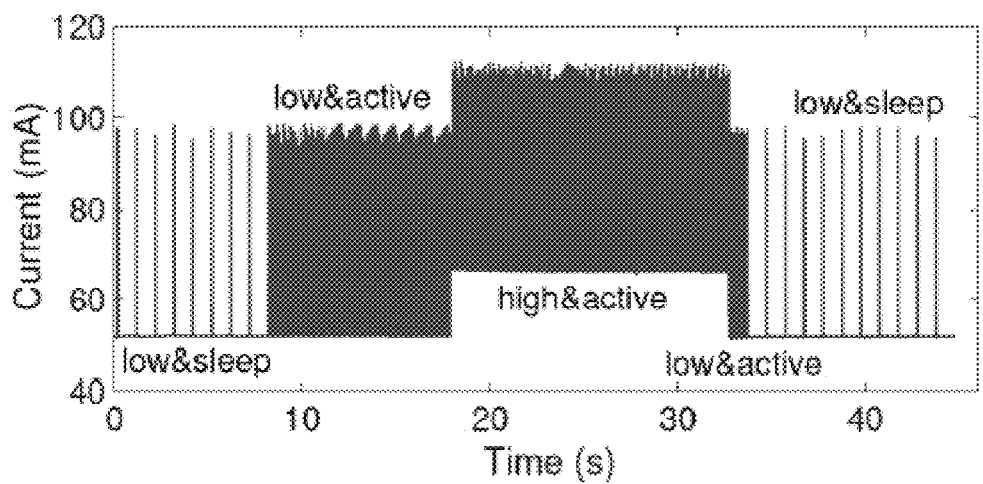
FIG. 27 is a graph showing power consumption of a prototype of the battery authentication system.

FIG. 27 plots the power consumption of the system prototype when operating in different states, which was measured with a Monsoon power monitor. Sampling the battery voltage (and the corresponding computation) draws about 45 mA current, and keeping the contactor connected requires another 20 mA current. Note that the background current of ≈50 mA is required by the controller, i.e., an Arduino Uno in this implementation, which can be reduced easily and significantly by using other low-power controllers, e.g., to 0.023 mA with Arduino Pro Mini.

The system uses the voltages triggered by a sequence of e-system operations as the authentication code, leading to a code space of $N^m$, where N is the number of different types of e-system operations available on a vehicle and m is the number of elementary operations a driver used in his/her authenticating operations. Note that some e-system operations have different intensities (e.g., setting air-con to different levels and "rolling" up/down different windows), each of which contributes to N separately.

It is readily understood that the battery authentication system can be easily extended to authenticate multiple drivers—i.e., allowing multiple (intended) drivers to customize their respective authenticating operations—by identifying the operations whose voltage fingerprint is closest to $\mathbb{U}_{j;i}$ according to Eq. 11.

Besides battery voltage, it is envisioned that the battery authentication system could use the discharge current of vehicle battery as another means to fingerprint authenticating operations, further improving the system's accuracy in identifying drivers. The system's voltage matching can be easily tuned to match the current. It is, however, challenging to monitor current with high precision, because the discharge current of vehicle battery varies from a few to several hundred amps.

Other variant for the battery authentication system include: (i) use a low-power controller, such as an Arduino Mini Pro, to reduce the power consumption; (ii) add a charging module to the prototype to charge its battery with the vehicle's alternator, which, in turn, requires a power distributor to control the charging of the vehicle battery and the system's battery; (iii) substitute the circuit breaker on the low-power path with a current limiter, to make its maximum current adjustable without changing the hardware components; (iv) use securer methods to reset the system; and (v) replace the contactor with an IGBT to reduce the size of the prototype.

The techniques described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

Some portions of the above description present the techniques described herein in terms of algorithms and symbolic representations of operations on information. These algorithmic descriptions and representations are the means used by those skilled in the data processing arts to most effectively convey the substance of their work to others skilled in the art. These operations, while described functionally or logically, are understood to be implemented by computer programs. Furthermore, it has also proven convenient at times to refer to these arrangements of operations as modules or by functional names, without loss of generality.

Unless specifically stated otherwise as apparent from the above discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system memories or registers or other such information storage, transmission or display devices.

Certain aspects of the described techniques include process steps and instructions described herein in the form of an algorithm. It should be noted that the described process steps and instructions could be embodied in software, firmware or hardware, and when embodied in software, could be downloaded to reside on and be operated from different platforms used by real time network operating systems.

The present disclosure also relates to an apparatus for performing the operations herein. This apparatus may be specially constructed for the required purposes, or it may comprise a computer selectively activated or reconfigured by a computer program stored on a computer readable medium that can be accessed by the computer. Such a computer program may be stored in a tangible computer readable storage medium, such as, but is not limited to, any type of disk including floppy disks, optical disks, CD-ROMs, magnetic-optical disks, read-only memories (ROMs), random access memories (RAMs), EPROMs, EEPROMs, magnetic or optical cards, application specific integrated circuits (ASICs), or any type of media suitable for storing electronic instructions, and each coupled to a computer system bus. Furthermore, the computers referred to in the specification may include a single processor or may be architectures employing multiple processor designs for increased computing capability.

The algorithms and operations presented herein are not inherently related to any particular computer or other apparatus. Various systems may also be used with programs in accordance with the teachings herein, or it may prove convenient to construct more specialized apparatuses to perform the required method steps. The required structure for a variety of these systems will be apparent to those of skill in the art, along with equivalent variations. In addition, the present disclosure is not described with reference to any particular programming language. It is appreciated that a variety of programming languages may be used to implement the teachings of the present disclosure as described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method for controlling power output by a battery in a vehicle, comprising:
   storing, by a controller, at least one fingerprint, where the fingerprint is indicative of a sequence of vehicle events and is derived from voltage measurements of the battery during the sequence of vehicle events;
   measuring, by the controller, voltage of the battery during a sequence of vehicle events to form a time series, where each vehicle event is powered by the battery;
   constructing, by the controller, an unknown fingerprint from the voltage measurements made during the sequence of vehicle events by normalizing magnitude of voltage measurements comprising the time series, where the unknown fingerprint is indicative of a sequence of vehicle events;
   comparing, by the controller, the unknown fingerprint to the at least one fingerprint;
   receiving, by the controller, a start signal, where the start signal is a request to start the engine of the vehicle; and
   in response to receiving the start signal and based on the comparison of the unknown fingerprint to the at least one fingerprint, outputting electric power from the battery to an electric starter motor of the vehicle.

2. The method of claim 1 further comprises restricting electric power output from the battery to the electric starter motor in response to a mismatch between the unknown fingerprint and the at least one fingerprint.

3. The method of claim 1 wherein measuring voltage of the battery further comprises measuring voltage of the battery at a first sampling rate; detecting turning of an ignition key to an on position; and measuring voltage of the battery at a second sampling rate in response to detecting the ignition key in the on position, where the second sampling rate is higher than the first sampling rate.

4. The method of claim 3 further comprises detecting turning of an ignition key to an off position and measuring voltage of the battery at the first sampling rate in response to detecting the ignition key in the off position.

5. The method of claim 1 wherein the vehicle events include turning on/off headlights, unlocking and locking doors, activating and deactivating windshield wipers and opening and closing a window.

6. The method of claim 1 further comprises applying a low pass filter to the voltage measurements of the time series and smoothing the voltage measurements of the time series before normalizing magnitude of voltage measurements.

7. The method of claim 1 wherein constructing an unknown fingerprint further comprises identifying one or more stable segments of voltage measurements in the time series and extracting unstable segments of voltage measurements from the time series, where magnitude of the voltage measurements in the one or more stable segments is the same within a given stable segment and the unstable segments are comprised of the voltage measurements that fall between two stable segments.

8. The method of claim 1 wherein comparing the unknown fingerprint to the at least one fingerprint further comprises computing a similarity metric between the unknown fingerprint and the at least one fingerprint.

9. The method of claim 1 further comprises comparing the unknown fingerprint to the at least one fingerprint using dynamic time warping.

10. The method of claim 1 further comprises updating the at least one fingerprint stored in the controller in response to a match between the unknown fingerprint and the at least one fingerprint.

11. A driver authentication system for a vehicle, comprising:
a switching circuit interconnecting a vehicle battery with an electric starter motor, where the switching circuit includes a low power circuit path, a high power circuit path and a switch that selectively connects the battery to at least one of the low power circuit path or the high power circuit path;
a data store storing one or more fingerprints, where each of the one or more fingerprints is indicative of a sequence of vehicle events and is derived from voltage measurements of the battery during the sequence of vehicle events;
a voltage sense circuit configured to measure voltage across the battery; and
a controller interfaced with the voltage sense circuit and the switch, wherein the controller constructs an unknown fingerprint from the voltage measurements made during a sequence of vehicle events, compares the unknown fingerprint to the one or more fingerprints and actuates the switch based on the comparison of the unknown fingerprint to the one or more fingerprints, where each vehicle event is powered by the battery.

12. The driver authentication system of claim 11 wherein high power circuit path of the switching circuit is coupled directly between the battery and the electric starter motor, the low power circuit path is arranged in parallel with the high power circuit path and the switch is disposed in the low power circuit path in an open position.

13. The driver authentication of claim 12 wherein the low power circuit path includes a circuit breaker in series with a potentiometer.

14. The driver authentication system of claim 12 wherein the controller operates to close the switch in the switching circuit in response to a match between the unknown fingerprint and at least one of the one or more fingerprints.

15. The driver authentication system of claim 12 further comprises an alarm interfaced with the controller, where the controller activates the alarm in response to a mismatch between the unknown fingerprint and at least one of the one or more fingerprints.

16. The driver authentication system of 11 wherein the controller samples the voltage measurements at a first sampling rate when an ignition key of the vehicle is in an off position, detects actuation of the ignition key to an on position, and samples the voltage measurements at a second sampling rate in response to detecting the ignition key in the on position, where the second sampling rate is higher than the first sampling rate.

17. The driver authentication system of claim 11 wherein the vehicle events include turning on/off headlights, unlocking and locking doors, activating and deactivating windshield wipers and opening and closing a window.

18. The driver authentication system of claim 11 wherein the controller updates the at least one fingerprint stored in the data store in response to a match between the unknown fingerprint and at least one of the one or more fingerprints.

19. The driver authentication system of claim 11 further comprises an input device interfaced with the battery and, upon being actuated by a person, is configured to discharge the battery.

* * * * *

UNITED STATES PATENT AND TRADEMARK OFFICE
CERTIFICATE OF CORRECTION

PATENT NO. : 11,479,207 B2
APPLICATION NO. : 16/823647
DATED : October 25, 2022
INVENTOR(S) : Kang G. Shin et al.

It is certified that error appears in the above-identified patent and that said Letters Patent is hereby corrected as shown below:

In the Claims

At Column 20, Claim number 13, Line number 20, after "authentication", insert --system--.

At Column 20, Claim number 16, Line number 32, after "of", insert --claim--.

Signed and Sealed this
Twentieth Day of December, 2022

*Katherine Kelly Vidal*

Katherine Kelly Vidal
*Director of the United States Patent and Trademark Office*